United States Patent
Erten et al.

(10) Patent No.: US 6,625,587 B1
(45) Date of Patent: Sep. 23, 2003

(54) BLIND SIGNAL SEPARATION

(75) Inventors: Gamze Erten, Okemos, MI (US); Fathi M. Salam, Okemos, MI (US)

(73) Assignee: Clarity, LLC, Troy, MI (US)

( * ) Notice: Subject to any disclaimer, the term of this patent is extended or adjusted under 35 U.S.C. 154(b) by 0 days.

(21) Appl. No.: 09/445,778

(22) PCT Filed: Jun. 18, 1998

(86) PCT No.: PCT/US98/13051

§ 371 (c)(1),
(2), (4) Date: Mar. 10, 2000

(87) PCT Pub. No.: WO98/58450

PCT Pub. Date: Dec. 23, 1998

Related U.S. Application Data

(60) Provisional application No. 60/050,147, filed on Jun. 18, 1997.

(51) Int. Cl.[7] ............... G06E 1/00; G06E 3/00; G06F 15/18; G06G 7/00
(52) U.S. Cl. ............... 706/22; 706/21; 706/24
(58) Field of Search ............... 706/22, 21, 24; 367/134

(56) References Cited

U.S. PATENT DOCUMENTS

| | | | |
|---|---|---|---|
| 5,140,670 A | 8/1992 | Chua et al. | 706/29 |
| 5,208,786 A | 5/1993 | Weinstein et al. | 367/124 |
| 5,355,528 A | 10/1994 | Roska et al. | 706/26 |
| 5,383,164 A | 1/1995 | Sejnowski et al. | 367/134 |
| 5,539,832 A | 7/1996 | Weinstein et al. | 381/94 |
| 5,706,402 A | 1/1998 | Bell | 706/22 |
| 6,185,309 B1 | 2/2001 | Attias | |
| 6,389,445 B1 | 5/2002 | Tsividis | |

FOREIGN PATENT DOCUMENTS

| | | | |
|---|---|---|---|
| WO | WO99/66638 | 12/1999 | H03H/21/00 |

OTHER PUBLICATIONS

Tatsuya Nomura et al; An Extention of the Herault– Jutten Network to Signals Including Delays for Blind Separation; IEEE; 0–7803–3550; 443–452.*

E. Weinstein, et al.; Multi–Channel Signal Separation by Decorrelation; IEEE Transactions on Speech and Audio Processing, vol. 1, No. 4, Oct. 1993 pp. 405–413.

C. Jutten and J. Herault; Blind Separation of Sources, Part 1: An adaptive algorithm based on neuromimetic architecture; Signal Processing, vol 24, No. 1, Jul. 1991, pp. 1–10.

C. Jutten and J. Herault; Blind Separation of Sources, Part II: Problems Statement; Signal Processing, vol. 24, No. 1, Jul. 1991, pp. 11–20.

F.M.Salam; An Adaptive Network for Blind Separation of Independent Signals; Proceedings of the 1993 IEEE International Symposium on Circuits and Systems (ISCAS) vol. 1, pp. 431–434.

A. Chihocki, et al.; Adapative Approach to Blind Source Separation with Cancellation of Additive and Convolutional Noise; 3rd. International Conference on Signal Processing; 1996, vol. 1; pp 412–415.

A.J. Bell, et al.; Blind Separation and Blind Deconvolution; An Information–Theoretic Approach; 1995 International Conference on Acoustics, Speech, and Signal Processing; ICASSP–95; vol 5; pp. 3415–3418.

(List continued on next page.)

*Primary Examiner*—Wilbert L. Starks, Jr.
*Assistant Examiner*—Joseph P. Hirl
(74) *Attorney, Agent, or Firm*—Brooks & Kushman P.C.

(57) ABSTRACT

Signal separation processing includes a signal separation architecture defining a relationship between at least one input signal and at least one output signal. The signal separation architecture includes a state space representation that establishes a relationship between the input and output signals. At least one output signal is based on the signal separation architecture.

51 Claims, 14 Drawing Sheets

OTHER PUBLICATIONS

G. Erten and F. Salam; Real Time Separation of Audio Signals Using Digital Signal Processors; MWSCAS 1997 Sacramento, California; IEEE 1997; pp 1237–1240.

FM Salam and G. Erten; Blind Signal Separation and Recovery in Dynamic Environments; NSIP 97 Workshop; Mackinac Island, Michigan, USA, in Sep. 1997.

Erten, G. et al., "Two Cellular Architectures for Integrated Image Sensing and Processing on a Single Chip", *Journal of Circuits, Systsms and Computers*, vol. 8, Nos. 5 & 6, Oct. 1998, pp. 637–659.

Erten, G. et al., "Modified Cellular Neural Network Architecture for Integrated Image Sensing and Processing", *Proceedings of the 1999 IEEE Intl. Symposium on Circuits and Systems*, vol. 5, Orlando, Florida, May 30–Jun. 2, 1999, pp. 120–123.

Hoang–Lan Nguyen Thi and Christian Jutten; "Blind Source Separation for Convolutive Mixtures"; Signal Processing European Journal Devoted to the Methods and Applications of Signal Processing; vol. 45, No. 2; Aug. 1, 1995; pp. 209–229.

Paul D. Gilbert, State Space and ARMA Models: An Overview of the Equivalence, Mar. 1993, pp. 1–26.

Craig Marven and Gillian Ewers, A Simple Approach to Digital Signal Processing, pp. 90–103.

* cited by examiner

BLIND SIGNAL SEPARATION

CROSS-REFERENCE TO RELATED APPLICATION

This application is the U.S. national phase of PCT application number PCT/US98/13051, filed Jun. 18, 1998, which further claims the benefit of U.S. provisional application serial No. 60/050,147, filed Jun. 18, 1997.

BACKGROUND OF THE INVENTION

1. Field of the Invention

The present invention relates to methods and apparatus for recovering original signal information or content by processing multiple measurements of a set of mixed signals. More specifically, the invention relates to adaptive systems for recovering several original signals from received measurements of their mixtures.

2. Discussion of Related Art

The recovery and separation of independent sources is a classic but difficult signal processing problem. The problem is complicated by the fact that in many practical situations, many relevant characteristics of both the signal sources and the mixing media are unknown.

To best understand the problem, the following problem statement is helpful: With reference to FIG. 1 of the drawings, consider N independent signals 102, $s_1(t), \ldots,$ and $s_N(t)$. Independent signals 102 may represent any of, or a combination of, independent speakers or speeches, sounds, music, radio-based or light based wireless transmissions, electronic or optic communication signal, still images, videos, etc. Independent signals 102 may be delayed and superimposed with one another by means of natural or synthetic mixing in the medium or environment 104 through which they propagate. A signal separation process 106 transforms the mixture of independent signals 102 into output signals 108, $u_1(t), \ldots,$ and $u_N(t)$.

Two main categories of methods are often used for the recovery and separation of independent sources: neurally inspired adaptive algorithms and conventional discrete signal processing.

Neurally inspired adaptive architectures and algorithms follow a method originally proposed by J. Herault and C. Jutten, now called the Herault-Jutten (or HJ) algorithm. The suitability of this set of methods for CMOS integration have been recognized. However, the standard HJ algorithm is at best heuristic with suggested adaptation laws that have been shown to work mainly in special circumstances. The theory and analysis of prior work pertaining to the HJ algorithm are still not sufficient to support or guarantee the success encountered in experimental simulations. Herault and Jutten recognize these analytical deficiencies and they describe additional problems to be solved. Their proposed algorithm assumes a linear medium and no filtering or no delays. Specifically, the original signals are assumed to be transferred by the medium via a matrix of unknown but constant coefficients. To summarize, the Herault-Jutten method (i) is restricted to the full rank and linear static mixing environments, (ii) requires matrix inversion operations, and (iii) does not take into account the presence of signal delays. In many practical applications, however, filtering and relative signals delay so occur. Accordingly, previous work fails to successfully separate signals in many practical situations and real world applications.

Conventional signal processing approaches to signal separation originate mostly in the discrete domain in the spirit of traditional digital signal processing methods and use the statistical properties of signals. Such signal separation methods employ computations that involve mostly discrete signal transforms and filter/transform function inversion. Statistical properties of the signals in the form of a set of cumulants are used to achieve separation of mixed signals where correlation of these cumulants are mathematically forced to approach zero. This constitutes the crux of the family of algorithms that search for the parameters of transfer functions that recover and separate the signals from one another. Calculating all possible cumulants, on the other hand, would be impractical and too time consuming for real time implementation.

Conventional signal processing approaches to signal separation originate mostly in the discrete domain in the spirit of traditional digital signal processing methods and use the statistical properties of signals. Such signal separation methods employ computations that involve mostly discrete signal transforms and filter/transform function inversion. Statistical properties of the signals in the form of a set of cumulants are used to achieve separation of mixed signals where these cumulants are mathematically forced to approach zero. This constitutes the crux of the family of algorithms that search for the parameters of transfer functions that recover and separate the signals from one another. Calculating all possible cumulants, on the other hand, would be impractical and too time consuming for real time implementation.

The specifics of these two methods are elaborated on below.

Neurally Inspired Architecture and Algorithms for Signal Separation

These sets of neurally inspired adaptive approaches to signal separation assume that the "statistically independent" signal vector $S(t)=[s_1(t), \ldots, \text{and } s_N(t)]^T$ is mixed to produce the signal vector $M(t)$. The vector $M(t)$ is received by the sensors (e.g. microphones, antenna, etc.).

Let the mixing environment be represented by the general (static or dynamic) operator $\tau$. Then, $$M(t)=\tau(S(t)) \qquad \text{Equation (1)}$$

There are several formulations that can be used to invert the mixing process, i.e. operator $\tau$, in a "blind" fashion where no a priori knowledge exists as to the nature or content of the mixing operator $\tau$ or the original sources $S(t)$. We group these into two categories, static and dynamic. Additional distinctions can be made as to the nature of the employed adaptation criteria, e.g. information maximization, minimization of high order cumulants, etc.

The static case. The static case is limited to mixing by a constant nonsingular matrix. Let us assume that the "statistically independent" signal vector $S(t)=[s_1(t), \ldots, \text{and } s_N(t)]^T$ is mixed to produce the signal vector $M(t)$. Specifically, let the mixing operator $\tau$ be represented by a constant matrix A, namely $$M(t)=AS(t) \qquad \text{Equation (2)}$$

FIGS. 2A and 2B show two architectures of the signal separation and recovery network in case of static mixing by a mixing matrix A. $U(t)$ is the output which approximates the original source signals $S(t)$. $Y(t)$ contains the values that are used in updating the parameters of the unmixing process, i.e., W in FIG. 2A and D in FIG. 2B. The architecture in FIG. 2A necessarily computes the inverse of the constant mixing matrix A, which requires that A is invertible, i.e. $A^{-1}$ exists. The Architecture of FIG. 2B does not impose the restriction in that upon convergence of off diagonal elements of the matrix D are exactly those of off diagonal elements of the matrix A. In this case, however, diagonal elements of the matrix A are restricted to equal "1.0." By setting the elements of D to zero, one essentially concludes that the mixing process may be invertible even if the mixing matrix is not. A shown in FIGS. 2A and 2B, the weight update utilizes a function of the output U(t). The update of the entries of these tow matrices is defined by the criteria used for signal separation, discrimination or recovery, e.g., information maximization, minimization of higher order cumulants, etc.

As an example, one possible weight update rule for the case where $$U(t) = WM(t) \quad \text{Equation (3)}$$

could be $$\dot{w}_{ij} = \eta \left[ W^{-T} + \frac{g''(u)}{g'(u)} M^T \right]_{ij} \quad \text{Equation (4)}$$

where $\eta$ is sufficiently small, g is an odd function, and M is the set of mixtures, U is the set of outputs which estimate the source signals, subscript T denotes transpose, and $-T$ denotes inverse of transpose. Note that the function g plays an additional role in the update which can be related to the above, diagram as $$Y(t) = g(U(t)) \quad \text{Equation (5)}$$

One uses Equation (4) to update the entries of W in Equation (3). Through this iterative update procedure, the entries of W converge so that the product WA is nearly equal to the identity matrix or a permutation of the identity matrix.

On the other hand, in FIG. 2B, one potentially useful rule for the update of the D matrix entries $d_{ij}$ is generically described as $$\dot{d}_{ij} = \eta f(u_i(t)) g(u_j(t)) \quad \text{Equation (6)}$$

where $\eta$ is sufficiently small. In practice some useful functions for f include a cubic function, and for g include a hyperbolic tangent function. When using this procedure, one computationally solves for U(t) from Equation (7) below $$U(t) = [I+D]^{-1} M(t) \quad \text{Equation (7)}$$

at each successive step and sample point. This computation is a potentially heavy burden, especially for high dimensional D.

The dynamic case. The dynamic mixing model accounts for more realistic mixing environments, defines such environment models and develops an update law to recover the original signals within this framework.

In the dynamic case, the matrix A is no longer a constant matrix. In reference to the feedback structure of the static example, it is simpler to view Equation (7) where $U(t) = [I+D]^{-1} M(t)$ as an equation of the fast dynamic equation $$\tau \dot{U}(t) = -U(t) - DU(t) + M(t) \quad \text{Equation (8)}$$

This facilitates the computation by initializing the differential equation in Equation (8) from an arbitrary guess. It is important however to ensure the separation of time scales between Equations (8) and the update procedure like the one defined by Equation (6). This may be ensured by making $\eta$ in Equation (6) and $\tau$ in Equation (8) sufficiently small.

If we assume the dimensionality of M(t) is N, a set of differential equations that define the dynamic signal separation algorithm can be written as $$\tau_i \dot{u}_i = -u_i - \sum_{j \neq i} D_{ij} u_i + m_i \quad \text{Equation (9)}$$

$$\text{for } i = 1, \ldots, N$$

This enumerates N differential equations. In addition, the adaptation process for the entries of the matrix D can be defined by multiple criteria, e.g. the evaluation of functions f and g in Equation (6). FIG. 3 is a pictorial illustration of the dynamic model in feedback configuration. U(t) approximates S(t). The function g defines the criteria used for weight update of the feedback network.

Application of signal separation criteria for adaptation of parameters. Little has been outlined in the way of procedures for the application of adaptation criteria within the architectures defined thus far. Two implied procedures have been noted:

First is the application of the signal separation functions, adaptation procedures and criteria to arbitrary random points of data—regardless of whether each of these points is practically and physically accessible or not. Thus, the adaptive separation procedure applies the adaptation functions and criteria to each element of the measured mixed signals individually and instantaneously, after which appropriate parameter updates are made.

The second type of procedure described in FIG. 2A uses Equation (3). In this case, the criteria is applied to the entire data set, or selected data points from the entire data set. Thus, the related adaptation process does not progress per sample, but utilizes the whole data set over which a constant, static mixing matrix is assumed to apply. Although this method is somewhat more robust than the first, it is essentially an offline method not suitable for real time signal separation. Furthermore, when the assumption of a static constant matrix is incorrect, the accuracy of the unmixing process suffers.

The Transfer Function Based Approach to Signal Separation

The representation of signal mixing and separation by transfer functions makes this approach a dynamic environment model and method.

A structure for separating two signals by processing two mixture measurements is illustrated in FIGS. 4A and 4B. FIGS. 4A and 4B show a conventional transfer function representation for a signal mixing and separation for a two signal system. The two signals $U_1$ and $U_2$ approximate $S_1$ and $S_2$. G inverts the mixing process modeled as H. Such a transfer function approach is neither practical nor extendible in the case of higher dimensional signals greater than two dimensions. Furthermore, the extension of the mixing environment to the transfer function domain has also eliminated the time domain nature of the signals. This also causes the exclusion of the initial conditions from the set of equations.

These architectures for the separation functions in the transfer function domain result in three serious shortfalls which are all impediments to the design and implementation of a practical method and apparatus. First, this formulation, as expressed, precludes the generalization of the separation procedure to higher dimensions, where the dimensionality of the problem exceeds two. In other words, a practical formalization of the separation method does not exist when there are more than two mixtures and two sources. One can illustrate this by direct reference to current methods, where matrix multiplication terms are written out, so that each scalar equation defines one of the entries of the resulting product matrix desired to be equal to zero. Since permutations of a diagonal matrix are also allowed, multiple sets of equations are created. For a two mixture problem, this results in two pairs (four total) of equations, each with two product terms. Beyond that the number of equations increases. To be precise the number of equations needed to describe the number of equations for a specific permutation of the N dimensional case is equal to $(N^2-N)$. For the two dimensional problem this value is 2.

Second, the inversion procedure for the transfer function is ad hoc and no recipe or teaching exists. The impact of dimensionality plays a crucial role in this. It is apparent from the method that the resulting architecture gives rise to networks requiring transfer components whose order is dependent on products of the transfer components of the mixing environment. Thus, one cannot design a network architecture with a fixed order.

Third, the initial conditions cannot be defined since the formulation is not in the time domain and cannot be initialized with arbitrary initial conditions. Hence, the method is not suitable for real time or on line signal separation.

What is needed is a method to separate mixed signals through media or channel wherein a high quality of signal separation is achieved. What is needed is a method to recover and separate mixed signals transmitted through various media wherein the separation of signals is of such high quality as to substantially increase (i) the signal carrying capacity of the medium or channel, (ii) the quality of the received signal, or (iii) both. The media or channels may include a combination of wires, cables, fiber optics, wireless radio or light based frequencies or bands, as well as a combination of solid, liquid, gas particles, or vacuum.

SUMMARY OF THE INVENTION

The present invention is directed toward a signal processing system for separating a plurality of input signals into a plurality of output signals. The input signals are composed of a mixture of a plurality of source signals that have been affected by a medium. The source signals are associated with a plurality of sources. The output signals estimate the source signals. The system comprises a plurality of sensors for detecting the input signals and a storage device for receiving and storing the input signals. The system also comprises an architecture processor for defining and computing a signal separation architecture, where the signal separation architecture defines a relationship between the input signals and the output signals, and the relationship has both constant parameters and time varying parameters. The system also comprises an update processor for computing a rate of change for each time varying parameter and the time varying parameters in response to the rate of change associated with each time varying parameter, and an output processor for computing the output signals based on the signal separation architecture, the constant parameters, and the time varying parameters.

DETAILED DESCRIPTION OF THE INVENTION

Figure 5A:
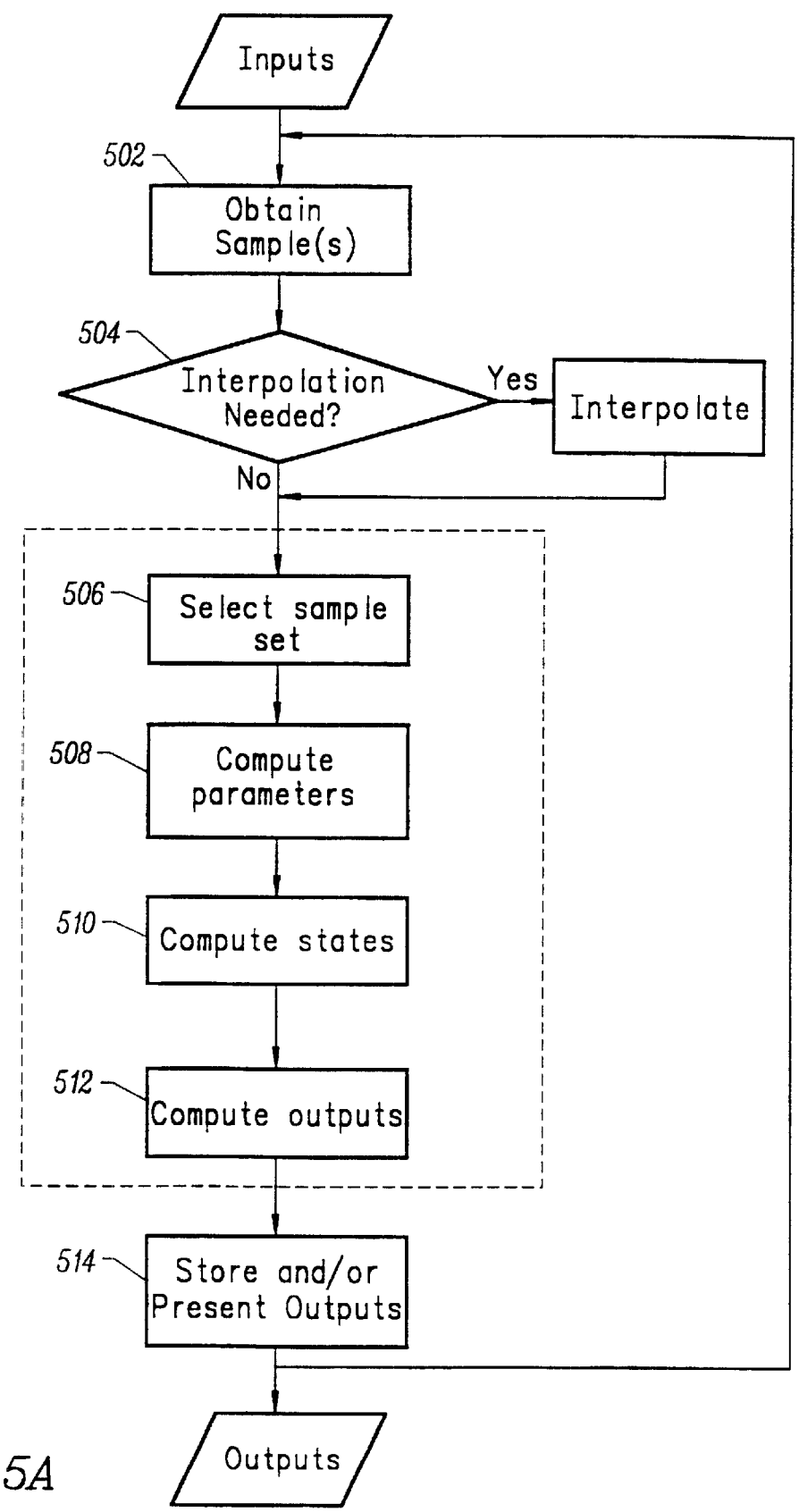
FIG. 5A shows a process flow diagram of a method of the present invention.

FIG. 5A shows a process flow diagram of a method of the present invention. This includes: (1) obtaining samples (block 502); (2) interpolating or upsampling (block 504); (3) selecting sample set (block 506); (4) computing adaptive parameters (block 508); (5) computing internal states (block 510); (6) computing outputs (block 512); and (7) storing and/or presenting outputs (block 514).

Obtaining samples includes obtaining the multi-channel data recorded through multiple sensors, e.g. microphones. Such data could also come from previously mixed sound tracks, e.g. recording studio mixed signals. Data can be sampled on line for a real time process or recalled from a storage medium, tape, hard disk drive, etc.

Interpolating is performed for algorithms that may require oversampling. If oversampling of the signal is not possible (e.g. prerecorded sound tracks) or not practical, one can interpolate between sample points to come up with more data points for the same duration of the signal. Upsampling can be performed depending on the sample rate of the obtained data and the target input sample rate, by upsampling by certain factor. For example, for making up data of 60 kHz from data sampled at 10 kHz, the upsampling factor is 6. In other words, five points are generated in between each sample point available.

Selecting sample set involves selecting the data points used at each iteration of the process.

Computing adaptive parameters may involve a method which uses the derivatives of a function to compute the value of the function (the function is the adaptive parameters in this case). Most of these methods are referred to as integration methods for solving differential equations, e.g. Runge Kutta.

Computing internal states involves looking at the architecture. These internal states may also be in the form of actual states and derivatives of these states, or in the form of samples in time. State values can be computed from their derivatives using various types of integration methods for solving differential equations, e.g. Runge Kutta.

Computing outputs uses the states and parameters computed earlier.

A distinction can be made in categorizing the architectures of the present invention. This pertains to the mixing and the separation process models and defines the procedure of separation discrimination or recovery—depending on the application environment and nature of the measured signals. This distinction sets the mathematical equations and axioms about both the mixing and separation models and thus applies to both the mixing and the separation procedures.

There are three sets of architectures and methods which can be itemized as follows:

1. Transfer function-based frequency domain architecture and method.
2. State space time domain architecture and method.
3. Mapping architecture and method.

Figure 5B:
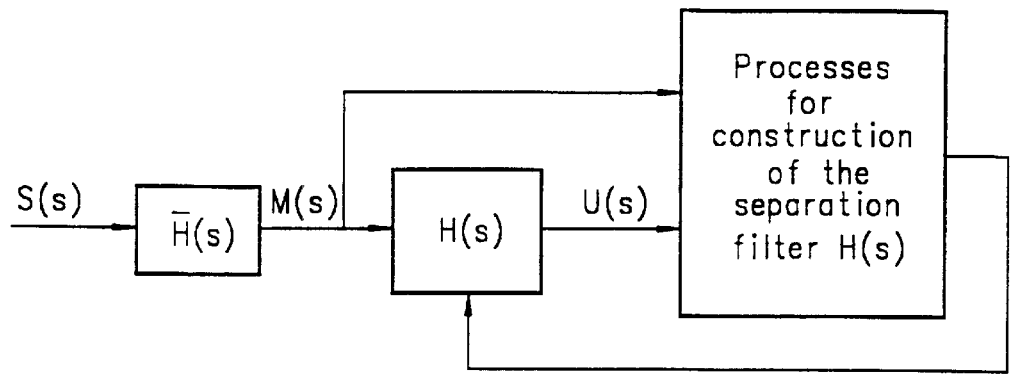
FIG. 5B shows a conventional transfer function frequency domain representation for signal mixing and separation.

Transfer Function Based Frequency Domain Signal Separation Architecture and Method FIG. 5B shows a conventional transfer function frequency domain representation for signal mixing and separation. U(s) and S(s) are multidimensional signals, and U(s) approximates S(s). H(s) inverts the mixing process which is modeled as $\overline{H}(s)$. The computation of this inverse may involve construction of conventional signal filters or maximization or minimization functions or criteria based upon optimal control theory and calculus of variations.

For the relationship between the measured mixed signals M(t) and the original sources of signals S(t) to be represented as a transfer function, one must assume that the environment is linear time invariant. This is because one can represent only linear time invariant relationships by a transfer function. Thus, formulation of the signal separation problem by a transfer function, while including dynamics and filtering effects, also assumes time invariant (stationary) environment.

There are, however, many applications of this formulation to well defined, band-limited signals about which many such assumptions can be made.

The relationship between the Laplace transform of the source signals S(t) i.e. S(s) and Laplace transform of the measured mixed signals M(t), i.e. M(s) are defined as follows:

$$\frac{M(s)}{S(s)} = \overline{H}(s) \qquad \text{Equation (10)}$$

The objective of this invention is, without knowing the actual $\overline{H}(s)$ to obtain H(s) as the inverse of $\overline{H}(s)$ and thus reconstruct the original signals.

The execution of this process for two signals, i.e. where the dimensionality of both S and M is two, is possible because for the product $$H(s)\overline{H}(s) = \begin{bmatrix} 1 & 0 \\ 0 & 1 \end{bmatrix} \qquad \text{Equation (11)}$$

or $$H(s)\overline{H}(s) = \begin{bmatrix} 0 & 1 \\ 1 & 0 \end{bmatrix} \qquad \text{Equation (12)}$$

For this two dimensional case, the set of equations that need to be satisfied are easily solvable. In extending the architecture to more than two signals one equates:

$$H(s)\overline{H}(s) = T(s) \qquad \text{Equation (13)}$$

where T(s) is of diagonal form. If one equates T(s) to the identity, where all diagonal entries equal 1.0, then $$H(s) = \overline{H}(s)^{-1} \qquad \text{Equation (14)}$$

and therefore $$H(s) = \frac{1}{det(\overline{H}(s))} adj(\overline{H}(s)) \qquad \text{Equation (15)}$$

where $adj(\overline{H}(s))$ is the matrix with (i,j)th entry computed as the (j,i)th cofactor. In turn, the (j,i)th cofactor is $(-1)^{j+i}$ the determinant of the matrix formed by removing the jth row and the ith column of $\overline{H}(s)$. One can further define $$H(s) \stackrel{\Delta}{=} adj(\overline{H}(s)) \qquad \text{Equation (16)}$$

Thus, a generalized structure for higher dimension emerges as a network defined by Equation (16). Note that, in this case, one has:

$$H(s)\overline{H}(s) = det(H(s))I \qquad \text{Equation (17)}$$

The actual formulation of the elements $h_{ij}(s)$ of the transfer function H(s) is dependent upon the characteristics of the mixing medium and the behavior and interactions of the original signal sources or their components.

The processes for the construction of the elements of the separation filter H(s) would require that the product $\overline{H}(s)H(s)$ be an identity matrix or a permutation thereof, or alternately a diagonal matrix as shown in Equation (17). The computation of this inverse becomes cumbersome beyond the two dimensional case. The addition of each signal creates a substantial computational burden. Nevertheless, if one knows the specifics of the signals and the mixing medium this procedure may in theory be followed.

An example procedure for the utilization of this architecture for signal separation discrimination and recovery can be summarized as follows:

1. Construct and allocate a memory structure which is used for storing the measurements as well as the results of the data obtained from processing of the measurements.
2. Construct a transfer function N×N element matrix to be the H(s) transfer function (inverse of the mixing transfer function), the entries of which are the scalar transfer functions.
3. Receive a new set of measurements, or mixed signals.
4. Process the new set of measurements.
5. Evaluate signal separation criteria and functions.
6. Update filter and transfer function element parameters accordingly.

7. Accumulate evidence for modification of transfer function parameters or definitions.
8. Process the new set of measurements to estimate the original signals (prior to mixing) and store results of these processes as necessary.
9. Evaluate successful separation and discrimination indicators.
10. If memory allocation is insufficient or inappropriate go to step 1.
11. If modification of the filter formulation is adequate continue, else go to step 2.
12. Go to step 3.

One can translate the transfer function into a state space representation with the added benefit of including the effect of initial conditions. This inclusion becomes especially important when one considers the mixing environment model in the general sense, e.g., the actual characteristics of the mixing transfer functions can vary in time. This particular method of the invention is described in the next section.

State Space Time Domain Architecture and Method

Figure 6A:
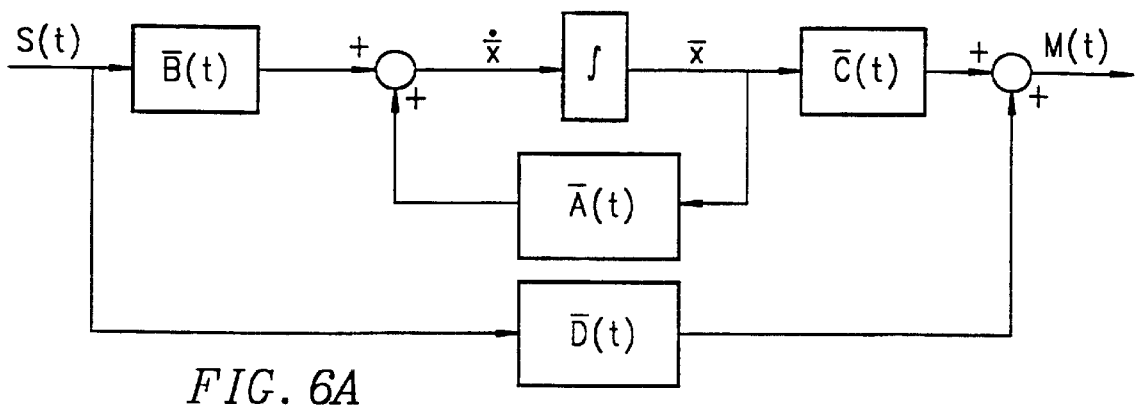
FIGS. 6A and 6B show two mixing models for the state space time domain architecture.
Figure 6B:
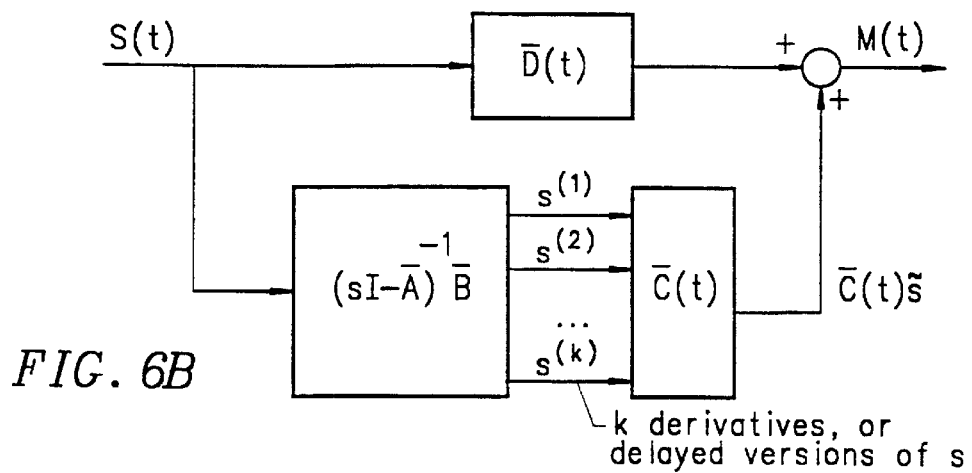

FIGS. 6A and 6B show two mixing models for the state space time domain architecture. FIG. 6A shows a general framework. FIG. 6B shows a special case where $\overline{A}$ and $\overline{B}$ and are fixed, and its relation to conventional signal processing. Both models apply to multiple types of separation architectures.

Figure 7A:
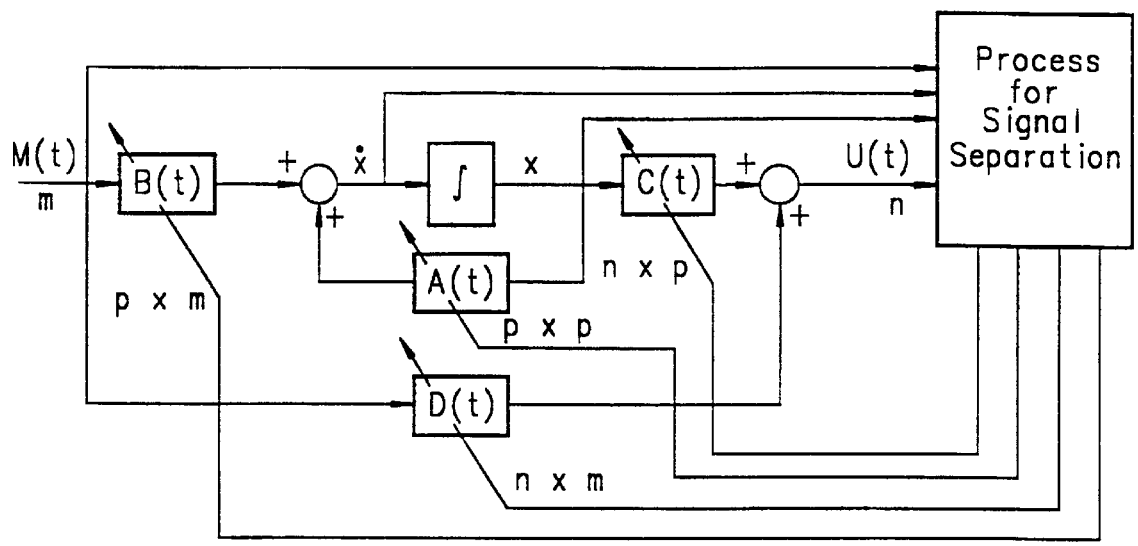
FIGS. 7A and 7B show two signal separation models for the state space time domain architecture.
Figure 7B:
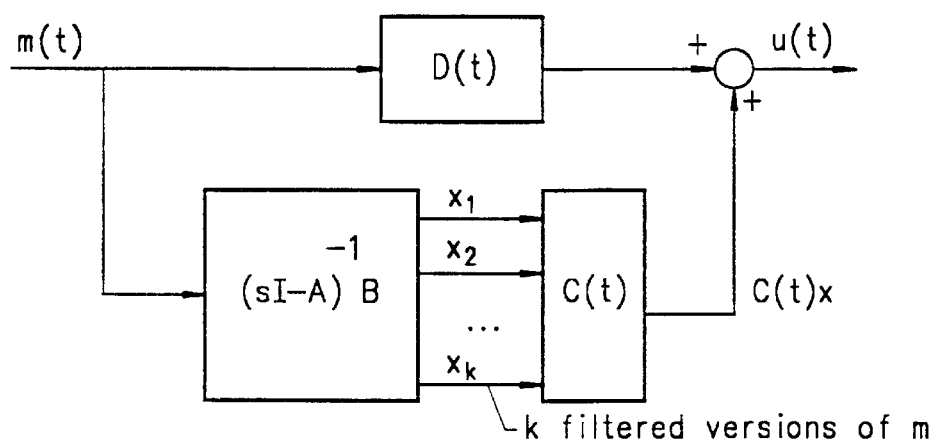

FIGS. 7A and 7B show two signal separation models for the state space time domain architecture. FIG. 7A shows a general model and architecture. FIG. 7B shows a special case, only the model is shown without the arrows in FIG. 7A which depict parameter update procedures.

This architecture of the invention models both the mixing and the separation environments as a linear dynamic system. In this way the parameters of the mixing environment are represented by the realization $\overline{\wp} = (\overline{A}, \overline{B}, \overline{C}, \overline{D})$ as depicted in FIG. 6A; whereas $\wp = (A, B, C, D)$ is the realization of the separation environment as depicted in FIG. 7A. These parameters dictate the dynamics of the environments for mixing and separation. While the realization $\overline{\wp}$ is quasi-constant and models the behavior of the mixing environment the realization $\wp$ is to be defined by the separation process.

The mixing model for the state space time domain architecture applies to multiple types of separation architectures. The model is an architectural depiction of the mathematical equations:

$$\dot{x} = \overline{A}x + \overline{B}s \qquad \text{Equation (18)}$$

$$m = \overline{C}x + \overline{D}s \qquad \text{Equation (19)}$$

On the other hand, as shown in FIG. 7A, the state space time domain signal separation architecture can mathematically be described as:

$$\dot{x} = Ax + Bm \qquad \text{Equation (20)}$$

$$u = Cx + Dm \qquad \text{Equation (21)}$$

This architecture defines the necessary procedure for the utilization of this mathematical structure in signal separation, discrimination and recovery. This requires the definition of a procedure or a set of procedures for the signal separation, discrimination and recovery algorithms in such a way that when these procedures are exercised, the necessary parameters converge to some stable or quasi-stable solution, the outputs of the separation and discrimination process are the replicas of, or sufficiently similar copies of, the original signal sources S(t).

The method of this architecture of the invention:

1. is capable of processing of multiple, i.e. more than two mixtures
2. is capable of including the effect of initial conditions directly
3. may be extended to include time variance by assuming that the matrices (A, B, C, D) and ($\overline{A}$, $\overline{B}$, $\overline{C}$, $\overline{D}$) are functions of time
4. may allow for incorporation of general nonlinear models, e.g. for the mixing $$x = \overline{\Gamma}(x, s, P_1) \qquad \text{Equation (22)}$$

$$m = \overline{\Phi}(x, s, P_2) \qquad \text{Equation (23)}$$

and for the separation $$x = \Gamma(x, s, W_1) \qquad \text{Equation (24)}$$

$$u = \Phi(x, s, W_2) \qquad \text{Equation (25)}$$

These equations may be extended to include nonlinear and time variant models by assuming that the operators $\Gamma$, $\overline{\Gamma}$, $\Phi$, $\overline{\Phi}$ in Equations 22–25 are functions of time.

In the linear case, one can show the inversion relationship between ($\overline{A}$, $\overline{B}$, $\overline{C}$, $\overline{D}$) and (A, B, C, D) as follows:
By Equation (19)

$$s = -\overline{D}^{-1}\overline{C}x + \overline{D}^{-1}m \qquad \text{Equation (26)}$$

and therefore with reference to Equation (21) given that u is the estimated source signals s, $$C \triangleq -\overline{D}^{-1}\overline{C} \qquad \text{Equation (27)}$$

and $$D \triangleq \overline{D}^{-1} \qquad \text{Equation (28)}$$

Similarly, by substituting $s = -\overline{D}^{-1}\overline{C}x + \overline{D}^{-1}m$ into Equation (18), one can show that $$A \triangleq \overline{A} - \overline{B}\overline{D}^{-1}\overline{C} \qquad \text{Equation (29)}$$

and $$B \triangleq \overline{B}\overline{D}^{-1} \qquad \text{Equation (30)}$$

In the event that $\overline{D}$ is not a square matrix, and is thus not invertible, such as the case where more measurements or mixtures are obtained than sources, one can follow a generalized procedure using the pseudoinverse $[\overline{D}^T\overline{D}]^{-1}$ assuming that $[\overline{D}^T\overline{D}]$, which is a square matrix, is in fact invertible.

In this fashion, one needs to rebuild the network with the appropriate update laws so that the network parameters become the following alternate versions of Equations (26–30):

$$s = -[\overline{D}^T\overline{D}]^{-1}\overline{D}^T\overline{C}x + [\overline{D}^T\overline{D}]^{-1}\overline{D}^Tm \qquad \text{Equation (31)}$$

$$C \triangleq -[\overline{D}^T\overline{D}]^{-1}\overline{D}^T\overline{C} \quad \text{Equation (32)}$$

$$D \triangleq [\overline{D}^T\overline{D}]^{-1}\overline{D}^T \quad \text{Equation (33)}$$

$$A \triangleq \overline{A} - \overline{B}[\overline{D}^T\overline{D}]^{-1}\overline{D}^T\overline{C} \quad \text{Equation (34)}$$

$$B \triangleq \overline{B}[\overline{D}^T\overline{D}]^{-1}\overline{D}^T \quad \text{Equation (35)}$$

One may solve for the parameters of A, B, C, and D to attain their solutions precisely or approximately by a variety of suitable computing techniques and appliances, including a variety of software and hardware components endowed with the practice of the invention. The input to such a computing appliance is an appropriate set of mixtures received through a plurality of detectors, with each detector receiving signals from a plurality of sources. After the processing of the input with the practice of the invention, the output from the computing device, is a set of separated signals, including restored source signals which closely estimate the original signals without interference.

Using several families of information maximization criteria, a variety of optimization functions and numerical solution methods, both continuous (as in analog electronics) and discrete time (as in digital computing) may be used as appropriate, such that the signal separation problem is solved by computing the selected set of optimization functions for a given set of mixtures.

One procedure for the utilization of this architecture for signal separation discrimination and recovery may be summarized as follows:

1. Construct and allocate a memory structure which is used for storing the measurements as well as the results of the data obtained from processing of the said measurements, and set measurement data acquisition or sampling rates.
2. Construct four matrices, A, B, C, and D, of appropriate dimensions.
3. Receive a new set of measurements, or mixed signals.
4. Process the incoming mixture signals and measurements by performing signal conditioning, storage and related procedures.
5. Evaluate signal separation criteria and functions.
6. Update the elements of the four matrices, or a subset of them, accordingly.
7. Accumulate evidence for modification of matrix dimensions, convergence rates, time constants and other parameters or definitions.
8. Process the new set of measurements to estimate the original signals (prior to mixing) and store results of these processes as necessary.
9. Evaluate successful separation and discrimination indicators.
10. If memory allocation or data measurement sampling rate is insufficient or inappropriate go to step 1.
11. If modification of the filter formulation is adequate continue, else go to step 2.
12. Go to step 3.

Special case. One can design a special case, where the canonical form of the mixing and separation model are modified from their canonical forms in Equations (18–21) so that A, $\overline{A}$, B, $\overline{B}$ are fixed. In FIGS. 6B and 7B, this special case is illustrated pictorially.

In conventional signal processing terms and related techniques, in relation to the mixing model, this special case yields a set of filtered and/or delayed versions of the source signals (s), upon which the mixing matrix $\overline{C}$ operates. The result of this operation is added to the result of the operation $\overline{D}$s Thus, one can rewrite Equation (10) as $$M(s)=\overline{H}(s)S(s)=\overline{C}(sI-A)^{-1}\overline{B}S(s)+\overline{D}S(s) \quad \text{(Equation 36)}$$

Similarly, in relation to the separation model and architecture, this special case yields a set of filtered and/or delayed versions of the mixtures m, upon which the matrix C operates. The result of this operation is summed with the result of the operation D on m to obtain the separated signals u.

$$U(s)=H(s)M(s)=[C(sI-A)^{-1}B+D]M(s) \quad \text{(Equation 37)}$$

The special case explicitly brings the congruence of the state space time domain architectures with the transfer function models. The procedure for the utilization of the canonical architecture form is very similar; the differences are highlighted as follows:

1. In step 2, A and B can be fixed.
2. In step 6, only the two matrices C and D would need to be updated.

Mapping Architecture and Method

The mapping architecture and method is an alternative embodiment for facilitating the physical realization and implementation of the previously described architectures and methods, especially by hardware accelerated emulation or a digital signal processor device. Towards this goal, the above models can be viewed in discrete time form by simply replacing the time derivatives by samples in time, i.e. $\dot{z}(t) \rightarrow z(t+1)$, where z can be x or $\overline{x}$ in the above formulations. Below a complete procedure is outlined for the implementation of the mapping architecture and method:

Let the mixing environment be represented by the time domain relation:

$$m(t) = \overline{D}s(t) + \sum_{k=1}^{L} \overline{C}_k s^{(k)}(t) - \sum_{k=1}^{N} \overline{A}_k m^{(k)}(t) \quad \text{(Equation 38)}$$

where (k) represents the kth derivative in the continuous time case, k delay samples in the discrete time case. As before, s(t) is the source, m(t) is the mixture, and u(t) are the separated output signals.

The signal separation network will be defined by $$u(t) = Dm(t) + \sum_{k=1}^{L'} C_k m^{(k)}(t) - \sum_{k=1}^{N'} A_k u^{(k)}(t) \quad \text{(Equation 39)}$$

where the dimensions of C and D are n×m, and the dimensions of A is n×n. Generally, $L' \geq L$ and $N' \geq N$, but the case where $L'<L$ and $N'<N$ may also be considered. Thus the realization can now be expressed as:

$$u(t)=W\Phi \quad \text{(Equation 40)}$$

where $$W=[DC_1 \ldots C_{L'}; -A_1 \ldots -A_{N'}] \quad \text{(Equation 41)}$$

and $$\Phi^T = [m(t)^T m^{(1)T} \ldots m^{(L')T}; u^{(1)T} \ldots u^{(N')T}]$$ (Equation 42)

Note that W is not necessarily a square matrix, i.e. W is of dimension n×[L'm+N'n].

The mapping model corresponds to the IIR (infinite impulse response) models in signal processing. Moreover, the special case of FIR (finite impulse response) models are obtained by eliminating the terms associated with derivatives of the output signal vector u(t).

Physical Realization and Implementation

Software emulation. The architectural representations of the transfer function-based frequency domain architecture, the state space time domain architecture and the mapping architecture may readily be translated into a computer program. For example, procedures above may be coded in a computer interpretable language and the resulting set of computer instructions may be executed on a compatible computing platform. Thus, software emulation is among the implementation options for this invention and involves the coding of the algorithm in a particular language in a way that it makes it possible to automatically execute it on a particular processor. High level languages such as FORTRAN and C/C++ have supporting processor-specific and general compilers that allow the code to become portable. Some of this code may be bundled with other functions and embedded onto an existing platform or included in processor's main program memory. On the other hand, more recent languages such as Java are platform independent so that the algorithm may be coded to run on multiple platforms in a network environment.

Hardware accelerated emulation. The procedures may also be coded or translated from a higher level language (e.g. C/C++, FORTRAN, etc.) to a specific signal processing device or by embedding the procedure within a specific device program or memory device both inside or outside a signal processor. This constitutes hardware accelerated implementation of the architecture described. Hardware accelerated emulation implementation could be fast enough for real time on line signal separation, discrimination and recovery. The devices that may be used for this purpose include, but are not limited to emerging high power digital signal processors (DSP), microprocessors, application specific integrated circuits (ASIC), programmable devices, including but not limited to field programmable gate arrays (FPGA), reconfigurable devices, in system programmable devices, programmable logic arrays (PLA), or other custom built or programmed automated structures with pre-specified or custom processor cores that compute fast multiplication and addition and offer flexible high precision.

Figure 8:
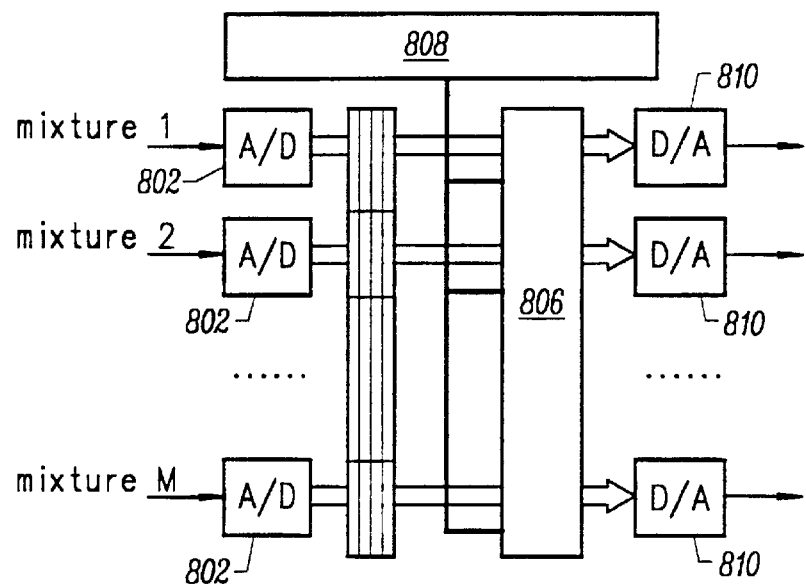
FIG. 8 shows a typical DSP implementation architecture.

FIG. 8 shows one possible DSP implementation architecture 800. DSP architecture 800 includes one or more A/D (analog to digital) converters 802 connected to a data stack 804. Data stack 804 is connected to a DSP 806 device, which in turn has access to a memory device 808 and D/A (digital to analog) converters 810. The internals of DSP device 806 may include a variety of functional units as shown below. Different configurations are possible depending on the nature of the application, number of mixtures, desired accuracy, etc.

Figure 9:
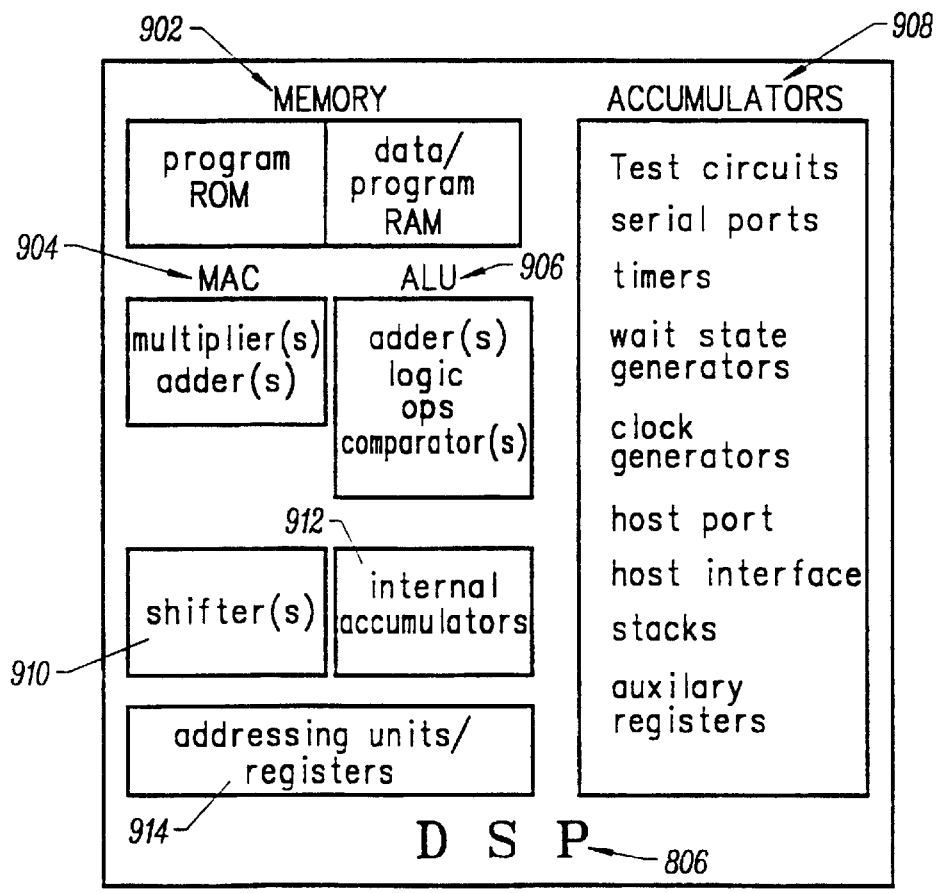
FIG. 9 shows a typical DSP internal architecture.

A block diagram depiction of a typical DSP device 806 is shown in FIG. 9. It may be convenient to integrate the signal separation process as part of other procedures already included to perform other signal processing functions particular to the device. A/D converters 802 and D/A converters 810 may be integrated into this structure for single chip solutions. DSP device 806 may include a memory device 902, a MAC (multiplier accumulator) 904, an ALU (arithmetic logic unit) 906, accumulators 908, shifters 910, internal accumulators 912, and address units and registers 914. Memory device 902 may include a program ROM data/program RAM. MAC 904 may include one or more multipliers and adders. ALU (arithmetic logic unit) 906 may include one or more adders, logic operators, and comparators. Accumulators 908 may include TEST circuits, serial ports, timers, wait state generators, clock generators, a host port, a host interface, stacks, and auxiliary registers.

One typical procedure is as follows: The incoming signals are transduced electrically and these mixtures are digitized and stored. The procedures, algorithms and architectures of this invention are then carried out for the separation, discrimination, and recovery of the individual source signals. One or more of the units described, e.g. DSPs and/or DSPs with multiple functional units can be used to carry out this process for real time operations. The DSP units may be programmed to carry out the steps needed to solve the equations that are associated with the algorithm. This program may be obtained by compiling the high level language to translate the procedure into assembly or machine language which the DSP device can decode and carry out. Custom crafted machine or assembly language code may further accelerate the execution of the algorithm by optimizing the procedure for the DSP functional units.

The outputs from these processes which form the approximations to the source signals may then be stored, converted to analog values, and/or processed further. Examples of further processing include signal conditioning, classification, recognition, demodulation, and other operations for signal processing.

Additional procedures that handle overdetermined (where number of mixtures are greater than the number of sources), underdetermined (where number of mixtures are less than the number of sources), varying (where the number of sources and mixtures vary) or unknown (where number of mixtures and/or sources are unknown) have been outlined in flowcharts. Furthermore, additional error checking, data integrity, and data identification schemes may enrich the possibilities and the application domains as well as robustness and reliability of the approach.

These procedures may readily be programmed into the DSP or the device in which the necessary signal separation, discrimination, and recovery functions are embedded.

Functions and Criteria for Parameter Adaptation

Several families of adaptation techniques may be applied to obtain the parameters of the architectures and methods of this invention.

Figure 1:
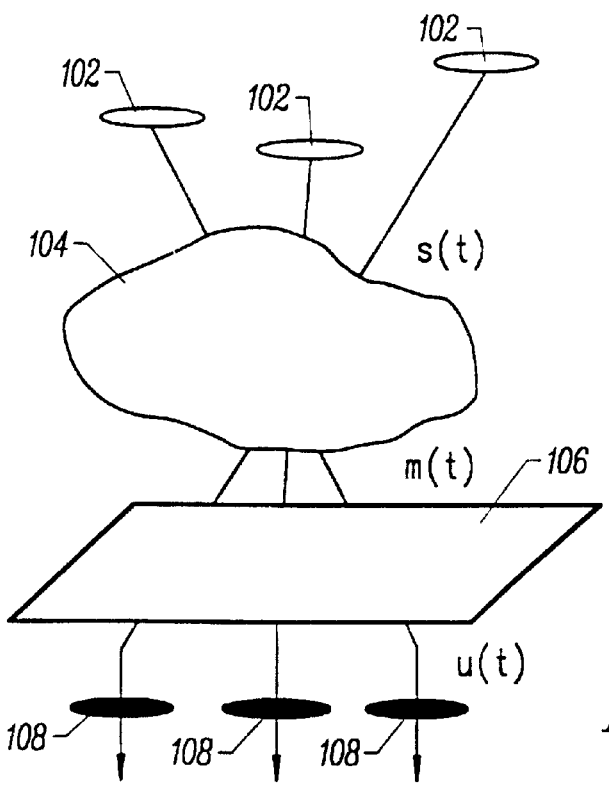
FIG. 1 shows a graphical depiction of the signal separation, discrimination and recovery problem.
Figure 2A:
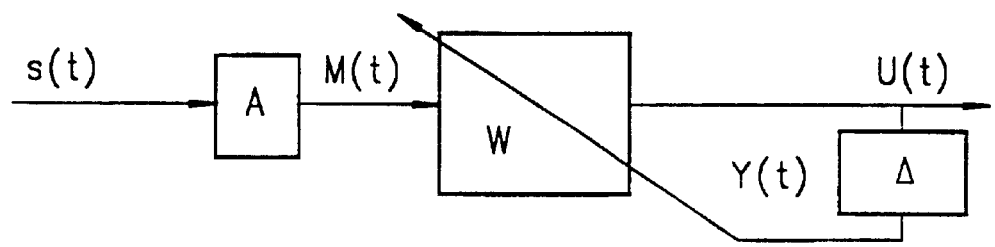
FIGS. 2A and 2B show two static neural network structures for signal separation.
Figure 2B:
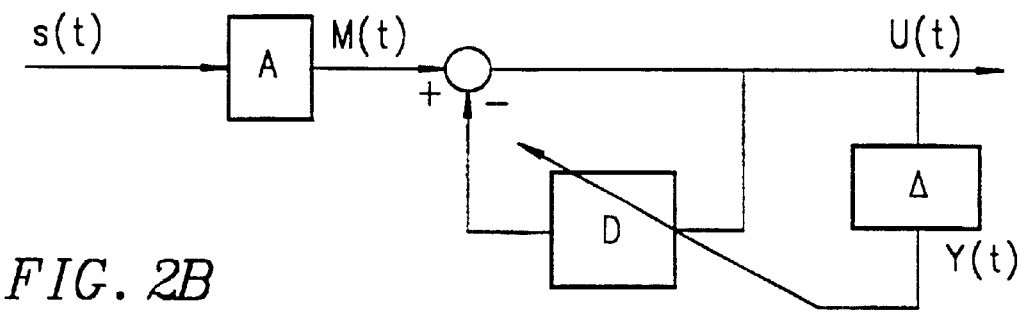
Figure 3:
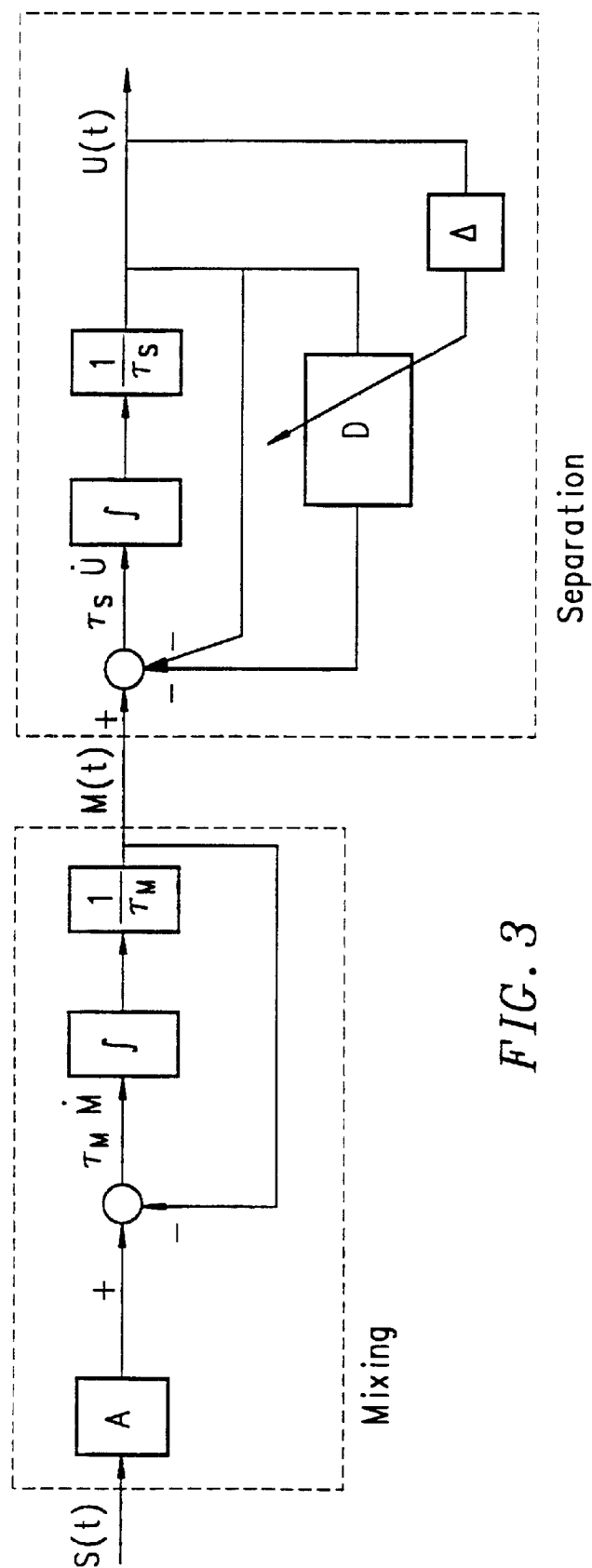
FIG. 3 shows an architecture of the signal separation and recovery network in case of feedback dynamic mixing and separation models.
Figure 4A:
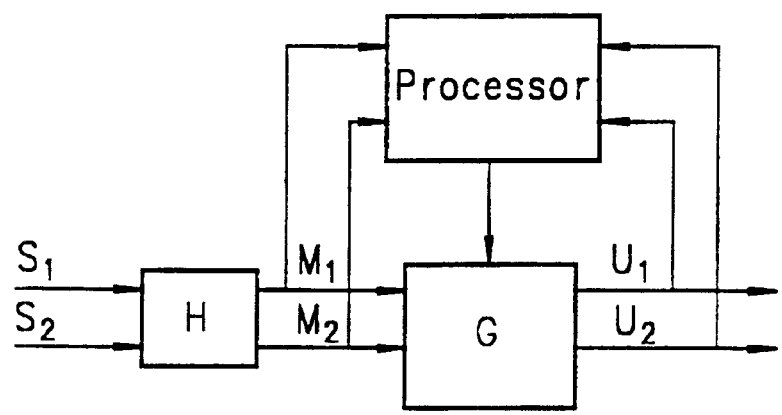
FIGS. 4A and 4B show a conventional transfer function representation and method for signal mixing and separation for a two signal system.
Figure 4B:
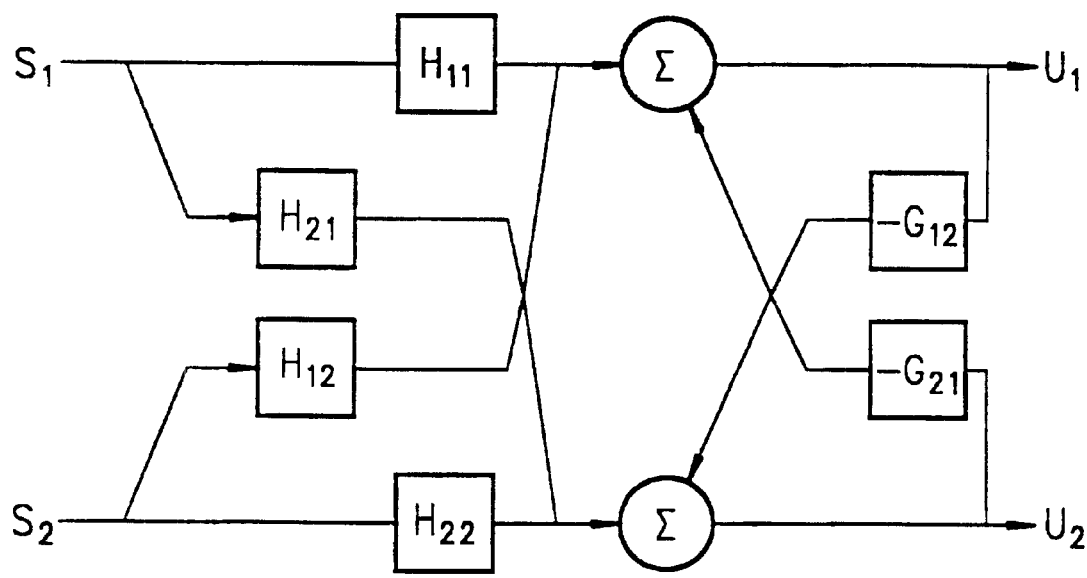

Neurally inspired static architecture. As described by Equation (3) and FIG. 2, signal separation in the case of a neurally inspired static architecture requires the computation of a weight matrix, W. For this, we first introduce the outer product matrix Q as $$Q = f(u)g(u)^T$$ Equation (43)

where f and g are two appropriate odd functions, which may or may not be related, and u is the set of output signals that estimate the input source signals u This matrix is a function of time as u is a function of time. Further dependence of time can be built into the functions f and g.

One can consider several categories of adaptation procedures based on Q in Equation (43), that yield the W matrix, by integrating one of the differential equations that mathematically describe the derivative of W, i.e. $\dot{W}$. As an example, in discrete time digital implementation, W can be computed by Euler approximation that relates the values of W to $\dot{W}$ as:

$$W_{t+1} = W_t + h\dot{W}_t \quad \text{Equation (44)}$$

where $\dot{W}_t$ is the derivative of W with respect to time at time t, and h is the step in time between the two successive values of W, i.e. $W_{t+1}$ and $W_t$.

Nine categories of weight update rules are described for W, as follows:

$$\dot{W} = \eta(\alpha I - Q) \quad \text{Equation (45)}$$

$$\dot{W} = \eta(\alpha I - Q)W \quad \text{Equation (46)}$$

$$\dot{W} = \eta(\alpha I - Q)W^{-T} \quad \text{Equation (47)}$$

$$\dot{W} = \eta(\alpha \text{diag}(Q) - Q) \quad \text{Equation (48)}$$

$$\dot{W} = \eta(\alpha \text{diag}(Q) - Q)W \quad \text{Equation (49)}$$

$$\dot{W} = \eta(\alpha \text{diag}(Q) - Q)W^{-T} \quad \text{Equation (50)}$$

$$\dot{W} = \eta(\alpha \overline{\text{diag}(Q)} - Q) \quad \text{Equation (51)}$$

$$\dot{W} = \eta(\alpha \overline{\text{diag}(Q)} - Q)W \quad \text{Equation (52)}$$

$$\dot{W} = \eta(\alpha \overline{\text{diag}(Q)} - Q)W^{-T} \quad \text{Equation (53)}$$

where $\alpha$ is a positive number. In Equations (45–53), $\eta$ is the rate of adaptation, where $\eta$ is a number that may vary during the process. The superscript (-T) represents inverse transpose, and diag(Q) is a diagonal matrix where all elements except the diagonal elements are equal to zero and the diagonal elements of diag(Q) are equal to those of Q. $\overline{\text{diag}(Q)}$ is time averaged values of the diag(Q).

State space architecture. As described by Equations (20–21), signal separation in the case of the state space time domain architecture requires the computation of matrices A, B, C, and D. For this, we first introduce two outer product matrices K and L as $$K = f(u)g(x)^T \quad \text{Equation (54)}$$

$$L = f(u)g(x)^T \quad \text{Equation (55)}$$

where f and g are two appropriate odd functions, which may or may not be related, and u is the set of output signals that estimate the input source signals s, m is the set of mixtures received, and x is the set of internal states. These matrices are functions of time as u, m, and x are functions of time. Further dependence of time can be built into the functions f and g.

One can consider several categories of adaptation procedures based on K and L in Equations (51–52), that yield the C and D matrices, assuming that, as given in the special case of the state space time domain representation, matrices A and B are fixed. As before with W, by integrating one of the differential equations that mathematically describe the derivative of C and D, one can obtain C and D. An example was given in Equation (44).

Nine categories of weight update rules are described for C as follows:

$$\dot{C} = \eta(\gamma I - K) \quad \text{Equation (56)}$$

$$\dot{C} = \eta(\gamma I - K)C \quad \text{Equation (57)}$$

$$\dot{C} = \eta(\gamma I - K)C^{-T} \quad \text{Equation (58)}$$

$$\dot{C} = \eta(\gamma \text{diag}(K) - K) \quad \text{Equation (59)}$$

$$\dot{C} = \eta(\gamma \text{diag}(K) - K)C \quad \text{Equation (60)}$$

$$\dot{C} = \eta(\gamma \text{diag}(K) - K)C^{-T} \quad \text{Equation (61)}$$

$$\dot{C} = \eta(\gamma \overline{\text{diag}(K)} - K) \quad \text{Equation (62)}$$

$$\dot{C} = \eta(\gamma \overline{\text{diag}(K)} - K)C \quad \text{Equation (63)}$$

$$\dot{C} = \eta(\gamma \overline{\text{diag}(K)} - K)C^{-T} \quad \text{Equation (64)}$$

where $\gamma \geq 0$ and $\overline{\text{diag}(K)}$ is time averaged values of the diag(K), which may be realized by averaging one or more samples of the diag(K) matrix.

In Equations (56–64), $\eta$ is the rate of adaptation, where $\eta$ is a number that may vary during the process. The superscript (-T) represents inverse transpose, and diag(K) is a diagonal matrix where all elements except the diagonal elements are equal to zero and the diagonal elements of diag(K) are equal to those of K. K was described in Equation (54).

Correspondingly, nine categories of weight update rules are described for D as follows:

$$\dot{D} = \eta(\alpha I - L) \quad \text{Equation (65)}$$

$$\dot{D} = \eta(\alpha I - L)D \quad \text{Equation (66)}$$

$$\dot{D} = \eta(\alpha I - L)D^{-T} \quad \text{Equation (67)}$$

$$\dot{D} = \eta(\alpha \text{diag}(L) - L) \quad \text{Equation (68)}$$

$$\dot{D} = \eta(\alpha \text{diag}(L) - L)D \quad \text{Equation (69)}$$

$$\dot{D} = \eta(\alpha \text{diag}(L) - L)D^{-T} \quad \text{Equation (70)}$$

$$\dot{D} = \eta(\alpha \overline{\text{diag}(L)} - L) \quad \text{Equation (71)}$$

$$\dot{D} = \eta(\alpha \overline{\text{diag}(L)} - L)D \quad \text{Equation (72)}$$

$$\dot{D} = \eta(\alpha \overline{\text{diag}(L)} - L)D^{-T} \quad \text{Equation (73)}$$

where $\alpha > 0$ and $\overline{\text{diag}(L)}$ is time averaged values of the diag(L), which may be realized by averaging one or more samples of the diag(L) matrix.

In Equations (65–73), $\eta$ is the rate of adaptation, where $\eta$ is a number that may vary during the process. The superscript (-T) represents inverse transpose, and diag(L) is a diagonal matrix where all elements except the diagonal elements are equal to zero and the diagonal elements of diag(L) are equal to those of L. L was described in Equation (55).

Equations (56–64) and (65–73) could be combined in a variety of ways. Since nine categories are shown for C and D, 81 permutations are possible.

Mapping architecture. The equations that apply to the neurally inspired static architecture, i.e. Equations (45–53) also apply to the mapping architecture, the parameters of which were described as a matrix W in Equations (40–41). To keep the dimension notation consistent, we rewrite the nine categories of weight update rules of this invention for the mapping architecture case. First, redefine L as:

$$L = f(u)g(\Phi)^T \quad \text{Equation (74)}$$

where the dimensions of f(u) is n×1, and the dimensions of $g(\Phi)^T$ is 1×N, where N=(L'+1)m+N'n in the notation of Equation (42).

Then, the following categories of weight update rules can be designed:

$$\dot{W} = \eta([I|0] - L) \quad \text{Equation (75)}$$

$$\dot{W}=\eta([I|0]-L)W \qquad \text{Equation (76)}$$

$$\dot{W}=\eta([I|0]-L)W^{-T} \qquad \text{Equation (77)}$$

$$\dot{W}=\eta(\text{diag}([L|0])-L) \qquad \text{Equation (78)}$$

$$\dot{W}=\eta(\text{diag}([L|0])-L)-Q)W \qquad \text{Equation (79)}$$

$$\dot{W}=\eta(\text{diag}([L|0])-L)W^{-T} \qquad \text{Equation (80)}$$

$$\dot{W}=\eta(\overline{\text{diag}([L|0])-L})-Q) \qquad \text{Equation (81)}$$

$$\dot{W}=\eta(\overline{\text{diag}([L|0])-L})-Q)W \qquad \text{Equation (82)}$$

$$\dot{W}=\eta(\overline{\text{diag}([L|0])-L})-Q)W^{-T} \qquad \text{Equation (83)}$$

In Equations (75–83), $\eta$ is the rate of adaptation, where $\eta$ is a number that may vary during the process. The superscript (−T) represents inverse transpose, and diag(L) is a diagonal matrix where all elements except the diagonal elements are equal to zero and the diagonal elements of diag(L) are equal to those of L. The notation [I|0] refers to a non-square matrix of dimension n×N composed of positive number alpha times the n×n identity matrix I and the rest of the columns (i.e. column N-n to N) are filled with zeroes. The notation diag[I|0)] signifies the diagonal elements of the n×n submatrix obtained by taking the first n columns from L. Bars on a quantity signify time-average over one or more samples. $W^{-T}$ signifies transpose of the pseudoinverse of the non-negative square matrix W. Observe that the update equations of this generalized W can be straightforwardly factored out in terms of the update laws for the components matrices $DC_1$ . . . , $C_L$, and $A_1$, . . . $A_N$.

Real Time on Line Parameter Adaptation

The architectures and procedures described above can be augmented with additional techniques to improve the signal separation and recovery procedures.

The unmixing (or, adaptive network weight) matrix entries may be updated for single instants of arbitrary data points calculated or obtained. Although by this method of application, it is possible to achieve real time on line signal separation, the method is also highly prone to errors since it allows a single point to alter the trajectory of the evolving solution. Another procedure for updating the parameters of the separation process applies the criteria to the entire data set, or selected data points from the entire data set. This method lacks causality essential to practical implementation: The related adaptation process does not progress in time or per sample, but utilizes the whole data set, including values in superseding instants. Moreover, a constant, static mixing matrix is assumed to apply over the whole range. Although this method is somewhat more robust than the first, it is essentially an offline method not suitable for real time signal separation. Furthermore, when the assumption of a static constant matrix is incorrect, the accuracy of the unmixing process suffers.

Figure 10:
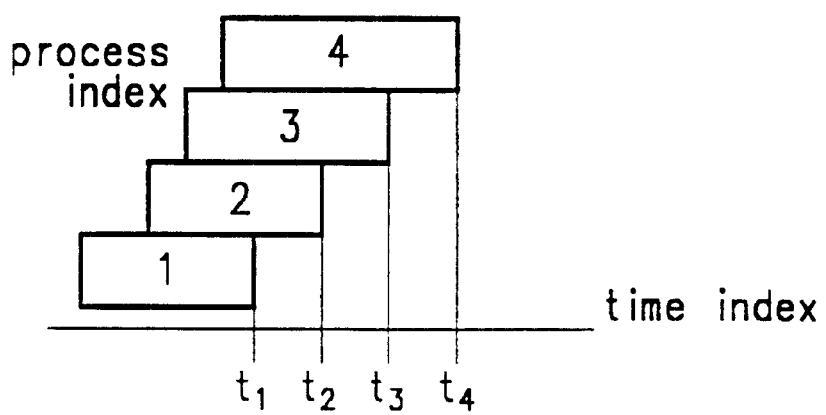
FIG. 10 shows multithreaded adaptation processes.

Continuous multithreaded adaptation. FIG. 10 shows multithreaded adaptation processes. Several signal separation processes may be overlapped in time to prevent parameter saturation and reduce the likelihood of sustained incorrect parameter estimation. Each rectangle represents a separation process. At the beginning of each process, the parameters are initialized and adaptation criteria are applied. At each point in time, there is one master process, the separation results from which are reported, and one or more slave processes.

Thus at each point in time, there is more than one process, the separation results from which are reported. Depending upon the application, each process output may be used in a variety of ways. Suppose, for example, among separated signals, only a single signal of interest needs to be estimated. In that case, there would be a master process that optimizes the quality of that signal of interest, whereas other process results are ignored. In another example, the redundant (or slave) process results may be compared with those from the master process and/or those from other slave processes to (1) access the success of each separation process, (2) evaluate and select the best initialization points, or (3) decide when a process should expire. When a master process expires, a slave process takes its place. In FIG. 10, at time index $t_1$, process 1 expires. At that point, depending upon the quality measure of their separation results, the best one of the other three slave processes may take its place as the master process.

Formation of a data buffer or set (long stack) to be used for parameter adaptation. As discussed, the application of signal separation criteria and computation and adaptation of separation parameters are executed on.either a single data point or on the whole data set obtained. Both of these are of limited use. In the case of the single data point, it is possible and probable that a single or a series of noisy points would change or divert the trajectory of the adaptation parameters from their ideal solution. On the opposite end of the spectrum, applying the separation criteria to the whole data set is often impractical since (i) the storage of every data point may not be possible and (ii) the latency created by the processing of all data points may be unacceptable.

For this reason, the present invention involves the creation of a real time on line running time window the size and contents of which can be adjusted depending upon various criteria imposed upon the measured signals, separated signals, or the time constraints of the particular application. These criteria would generally measure the level of success of the separation or discrimination process, such parameters as power spectrum of the measured or separated signals, statistical similarity of the separated or measured signals, or be guided by the human user of the separation process. The long stack may be contained in a storage device, a digital or analog recording medium.

Figure 11:
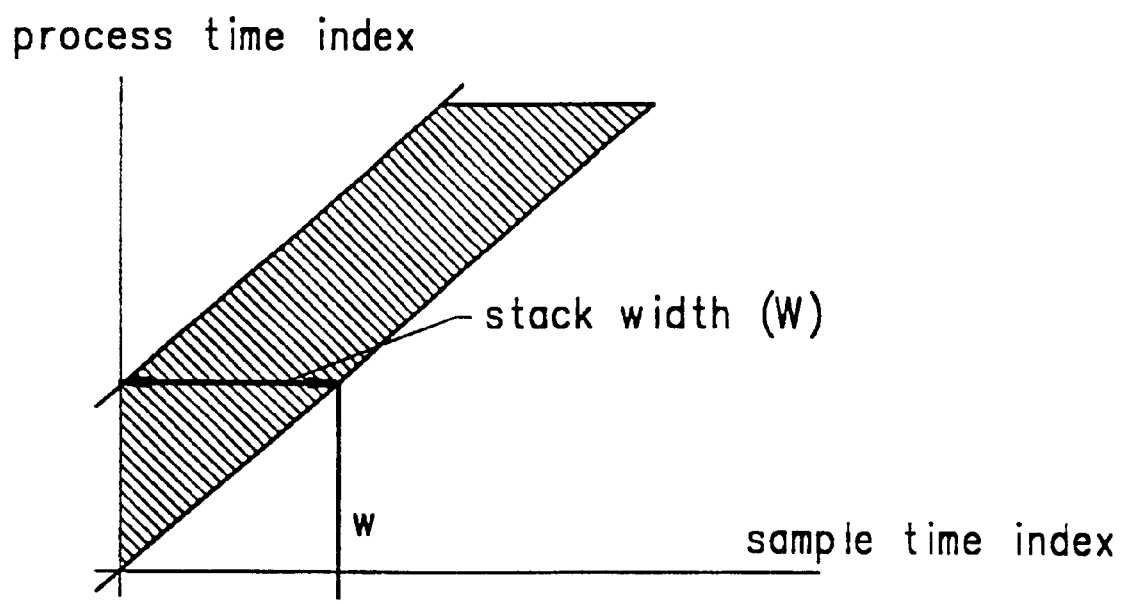
FIG. 11 shows one embodiment of a constant width long stack based on a first in first out (FIFO) stack construct and data acquisition process.

The contents of the data set may be modified after a new set of measured signals are obtained. The most straightforward way this may be done is by simply eliminating from the data set the oldest data points. This may be done by constructing a first in first out (FIFO) type stack as shown in FIG. 11. FIG. 11 shows one embodiment of a constant width long stack based on a first in first out (FIFO) stack construct and data acquisition process. The shaded region indicates the contents of the long stack in this case. Until sample time=W, every data set obtained is stored. When sample time=W, the stack is full. Beyond this point, the oldest data set is deleted from the stack. Note that this is a simplified illustration of the invention and the stack may not be of FIFO type or of constant width. The procedure below is an example of a program based on this invention for selecting a data set:

1. Set the length of data stack.
2. Initialize parameters of signal separation.
3. Obtain the set of measurements of the current time instance.
4. Is this a useful data set or point?
   No→Is it desirable to perform separation on this data set?
       Yes→Go to step 6.
       No→Go to step 3.
   Yes→Is the data stack full?

No→Store data point as the most recent data point.
Yes→Discard oldest data point store this data point as the latest.
5. Is it desirable to perform separation on this data set?
   Yes→Go to step 6.
   No→Go to step 3.
6. Perform the signal separation procedure.
7. If this was a useful data point then store the results of the separation process in the data stack.
8. If checkpoint is reached, evaluate the success of the separation process.
9. Is separation satisfactory?
   No→Go to step 1.
   Yes→Is it desirable to reduce stack size?
      No→Go to step 3.
      Yes→Go to step 1.

It is possible to introduce latencies into the process, that is one may output the result of the signal separation performed on samples obtained prior to the current time instance, rather than the sample most recently available.

Figure 12:
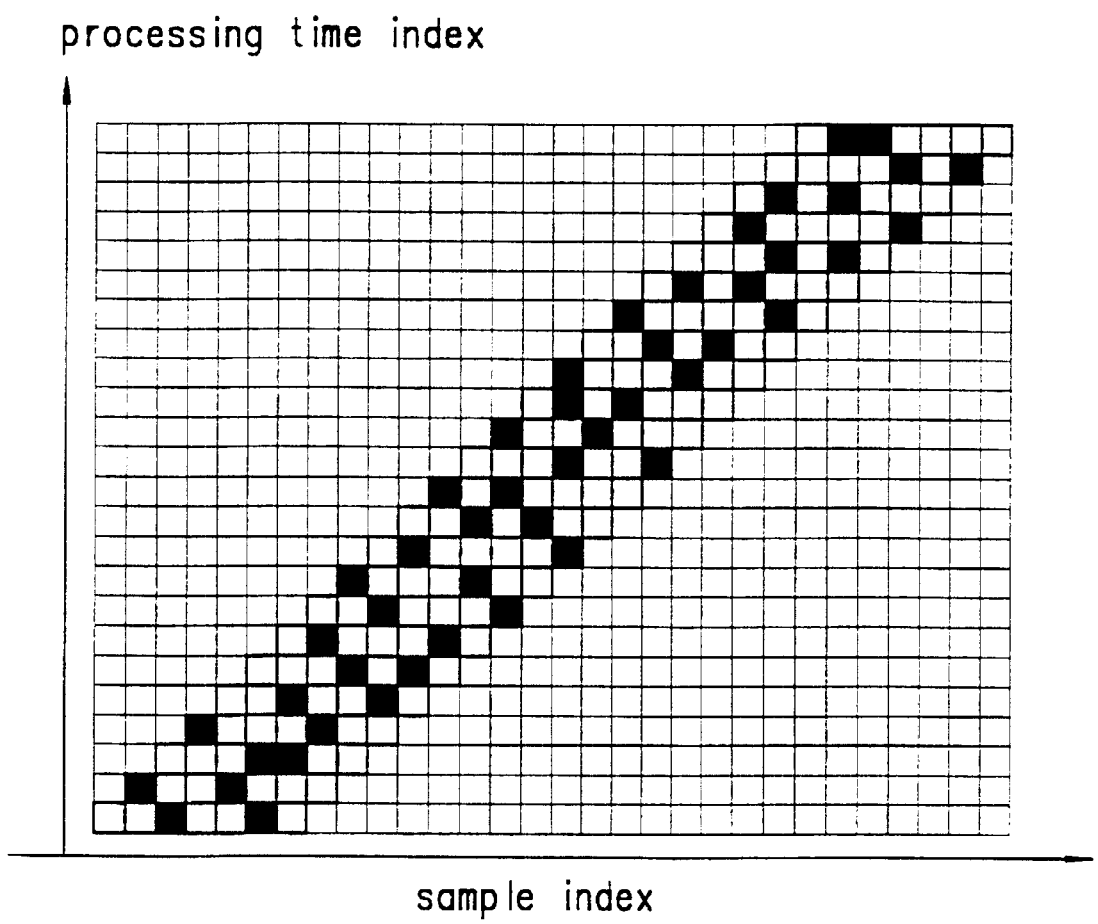
FIG. 12 shows another embodiment of a constant width long stack based on a first in first out (FIFO) stack construct.

Stochastic or deterministic selection of a subset of elements (short stack) from the long stack for application of adaptive parameter estimation criteria. Prior to the execution of the signal separation and discrimination algorithms, in particular, prior to the application of the adaptive parameter estimation criteria, one needs to select which data points from the long stack to use. A simplified illustration of the concept is shown in FIG. 12. FIG. 12 shows an example of a constant width long stack based on a first in first out (FIFO) stack construct that is seven elements deep. The shaded region indicates the contents of the long stack in this case. Until sample time=7, every data set obtained is stored. When sample time index=7, the stack is full. Beyond this point, the oldest data set is deleted from the stack. Two elements are selected from the long stack to form the short stack at each process time index. These elements are shown as black squares.

No such selection is required if one uses either the latest set of results and measurements or the entire set of results and measurements. The latter computation is noncausal since present outputs will depend on future mixtures. Hence the latter computation can only be performed offline. As already presented in real time execution of the signal separation and discrimination algorithms this is often not practical.

It may be desired that one uses a select set of the entire data stack available—either by deterministically, randomly, or pseudorandomly selecting a set of points from it. The deterministic selection is entirely predictable and will be the same with a set of identical data each time. The use of random or pseudorandom selection criteria; however, may yield different selected sets even with identical data.

One powerful deterministic criteria is to expand or contract the size of the short stack starting from, expanding around or ending at a random or predetermined index of the long stack. This process may be guided by the results of the separation process, i.e. the quality of the separation and discrimination received may be used for defining the index of the data in the long stack, increasing or decreasing the number of data elements of each point in the short stack, the size of the short stack and the numerical accuracy of the data in the short stack. Deterministic procedures may be combined with stochastic procedures, such as those that randomly select the length, numerical accuracy, starting point and elements of the short stack. The stochastic procedures may utilize appropriate probability distribution functions to define the indices of the elements in the long stack that will be included in the short stack. For instance, the probability distribution of indices may favor or disfavor the selection of recent points. The definition of the probability distribution may itself be a stochastic or deterministic process based on original and separated signal and mixing characteristics at the time of the computation. Computations of updates for the network may all be causal, i.e. the present value of the output depends only on present and past values of the mixture.

Figure 13A:
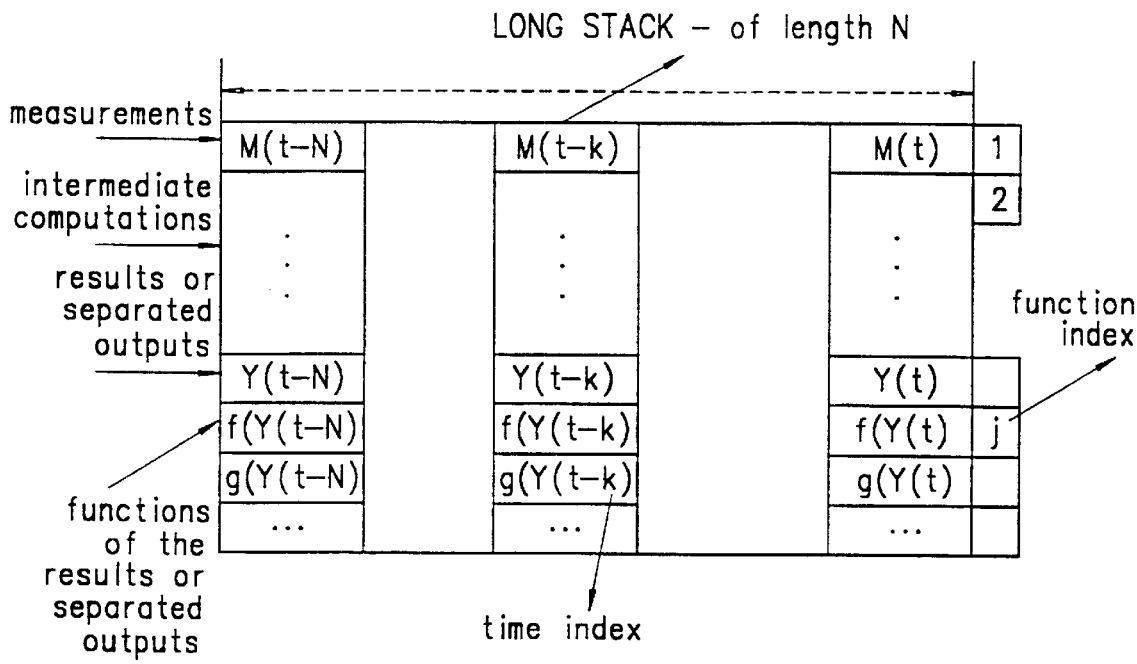
FIGS. 13A and 13B show an application of the separation criteria using a set of data points (short stack) from a long stack which contains all relevant sets of data points, measured or computed over a window of time.
Figure 13B:
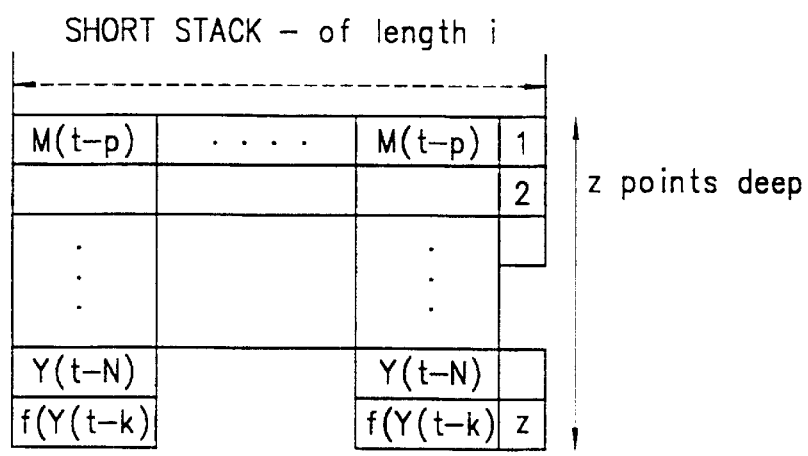

FIG. 13 shows the application of the separation criteria using a set of data points (short stack) from a long stack which contains all relevant sets of data points, measured or computed over a window of time. In FIG. 13, it is shown pictorially the construction and elements of the long and short stacks. The long stack is N elements wide and M elements deep. The functions are grouped by their time index k. There are N time instances which contain M results of the computation, including the measured signals and the estimated original sources or the separated signals, the results of intermediate computations, and various functions thereof. The contents of the long stack represent a moving window or history of measurements and computations. The most recently measured and computed data points are appended to the stack entry with the latest index whereas the least recent set of said points are purged from the stack. As suggested earlier, the size of the stack itself need not be constant.

The short stack is a subset of selected entries from the long stack for the computation at a particular time instance. The short stack contents are also modified at every instance in time when a computation is performed. The short stack entries selected at time t are used at time t to compute the estimated original signals or separated signals. However, note that although time t is the time of computation, it need not be the time associated with the separated output. There may be a latency in the output that is a look-ahead scheme could be at work so that the computation at time t is the separated signal for time t−L where L represents the latency.

Thus, the algorithm of the present invention and framework consider general time domain systems making the invention capable of accommodating changing phenomena of signal delays and other nonlinear events which are routinely experienced in practice with signal and wave propagation, transmission and transduction.

The present invention also allows for statistically significant intervals to be processed and exploits the various forms of weighing of the outputs by manipulating the criteria of selecting the entries of the long and particularly the short stack.

Recursive procedures for adaptive parameter estimation. In a variety of applications, especially when high accuracy of the separation process is desired, one may recursively apply the signal separation process, that is the outputs from the signal separation process can be treated as inputs to the next separation process until desired accuracy is achieved. Each successive process of separation may use the same or different model, architecture, and parameters from the previous process. This method may also be combined with other real time on line procedures of this invention, such as the multithreaded adaptation procedure.

Audio Signal Processing Application

For speech, speaker, and/or language recognition and processing, given the computational challenges associated with these processes, or due to objectives of user privacy and/or surveillance, it is desirable to obtain noise free clear signals, e.g. speech segments that are uncorrupted by noise, environmental sounds, and other speakers. The signal separation architectures and algorithms of this invention may be used as a front end towards this goal. Microphone arrays may be used to obtain multiple versions of speech (and other) signals. These may be the mixture signals used in signal separation to obtain the original individual signals or speech segments. These segments will contain less noise and other sources of interference than the original signals picked up by the microphones.

Figure 14:
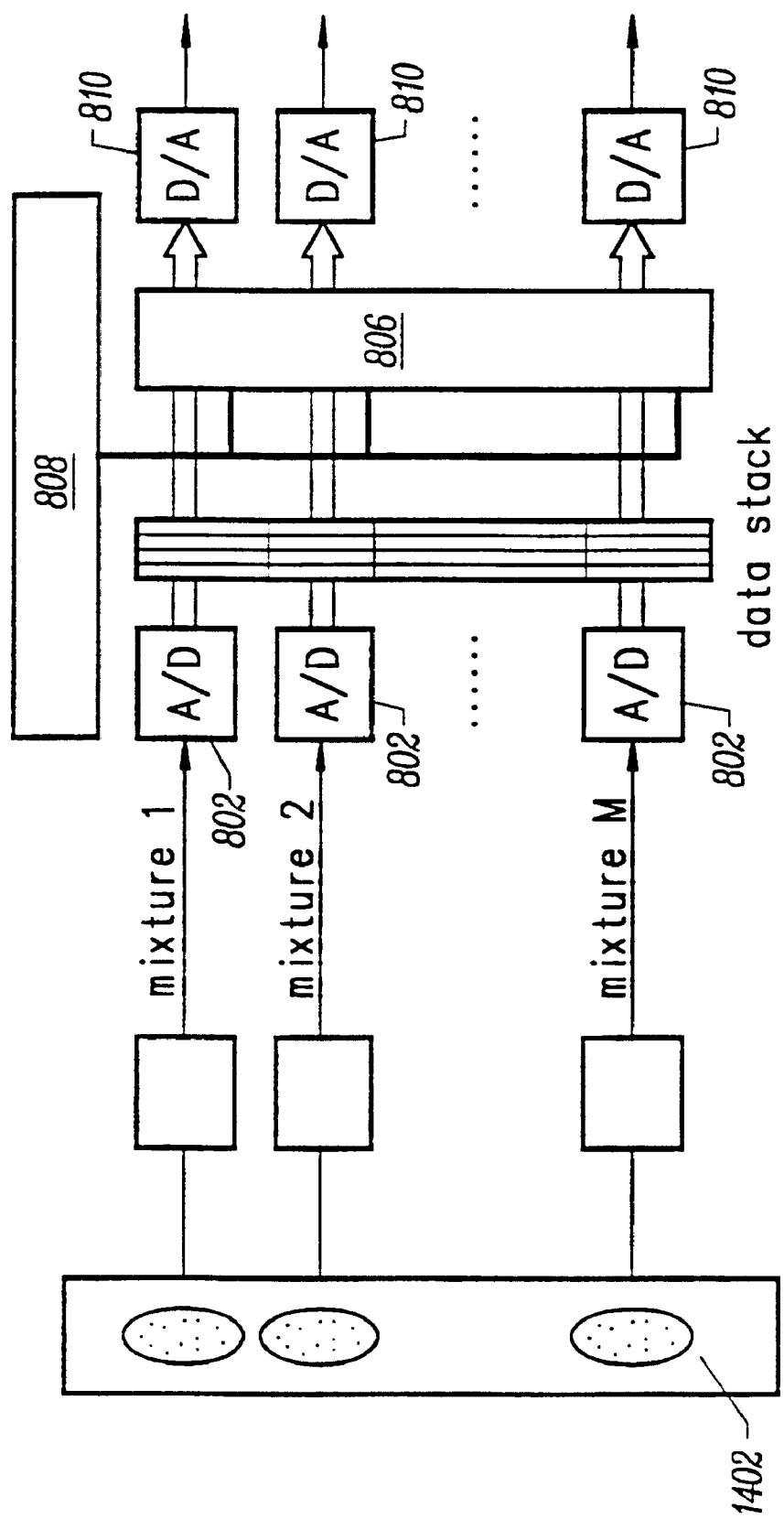
FIG. 14 shows an audio application based on the signal separation and recovery procedures of this invention.

FIG. 14 shows an audio application based on the signal separation and recovery procedures of this invention. Audio signals are converted electrical signals by the elements of a microphone array 1402. Each element of microphone array 1402 receives a different version (or mixture) of the sounds in the environment. Different arrangements of microphone elements may be designed depending on the nature of the application, number of mixtures, desired accuracy, and other relevant criteria. Following some signal conditioning and filtering, these mixture signals are converted from analog format to digital format, so that they can be stored and processed. The DSP device 806 of the system is programmed in accordance with the procedures for signal separation and recovery procedures of this invention. The internals of DSP device 806 may include a variety of functional units for various arithmetic and logic operations, and digital representation, data storage and retrieval means to achieve optimum performance. Circuits and structures shown in figure may undergo further integration towards realization of the whole system on a single chip. FIG. 14 illustrates the application specific system in the framework of the hardware accelerated implementation option shown in FIG. 8.

Figure 15:
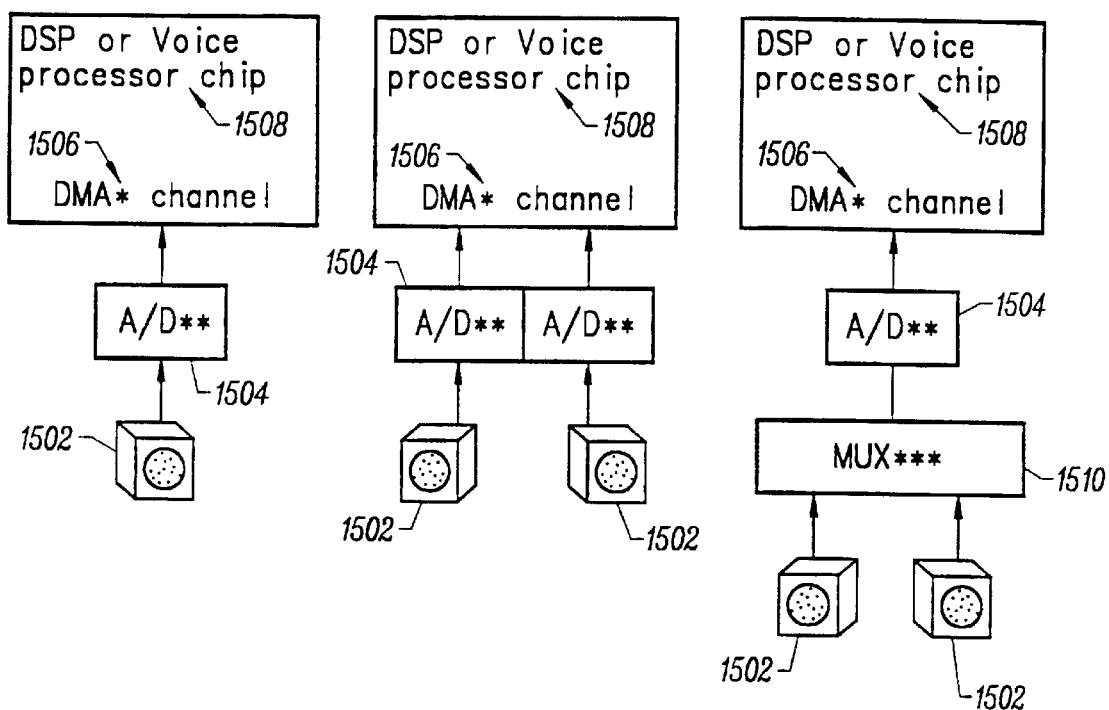
FIG. 15 shows three audio input interfaces to the DSP based handheld device that can be embedded into the microphone-DSP interface.

FIG. 15 shows three audio input interfaces to the DSP based handheld device that may be embedded into the microphone-DSP interface. On the very left is the prevalent interface to a microphone 1502. Microphone 1502 is connected to an A/D converter 1504, which is in turn connected to a DMA (direct memory access) channel 1506 and DSP or voice processor chip 1508. In the middle it is shown that microphones 1502 in a straightforward way, as is the case in FIG. 14. This may use another A/D converter 1504 and perhaps more importantly another DMA channel 1506 of the DSP or processor chip 1508. On the very right we show a potential way in which this impact could be reduced using a multiplexer 1510. The select signal to multiplexer 1510 is not shown, but it may be generated from the sampling clock in a straightforward way. Note that in the case of the multiplexed input, the impact on the audio signal path is minimized. One may also consider a slight variation where, if simultaneous sampling is desired, one may sample using two A/D converters 1504 and multiplex the digitized data instead of the (analog) microphone outputs.

Figure 16:
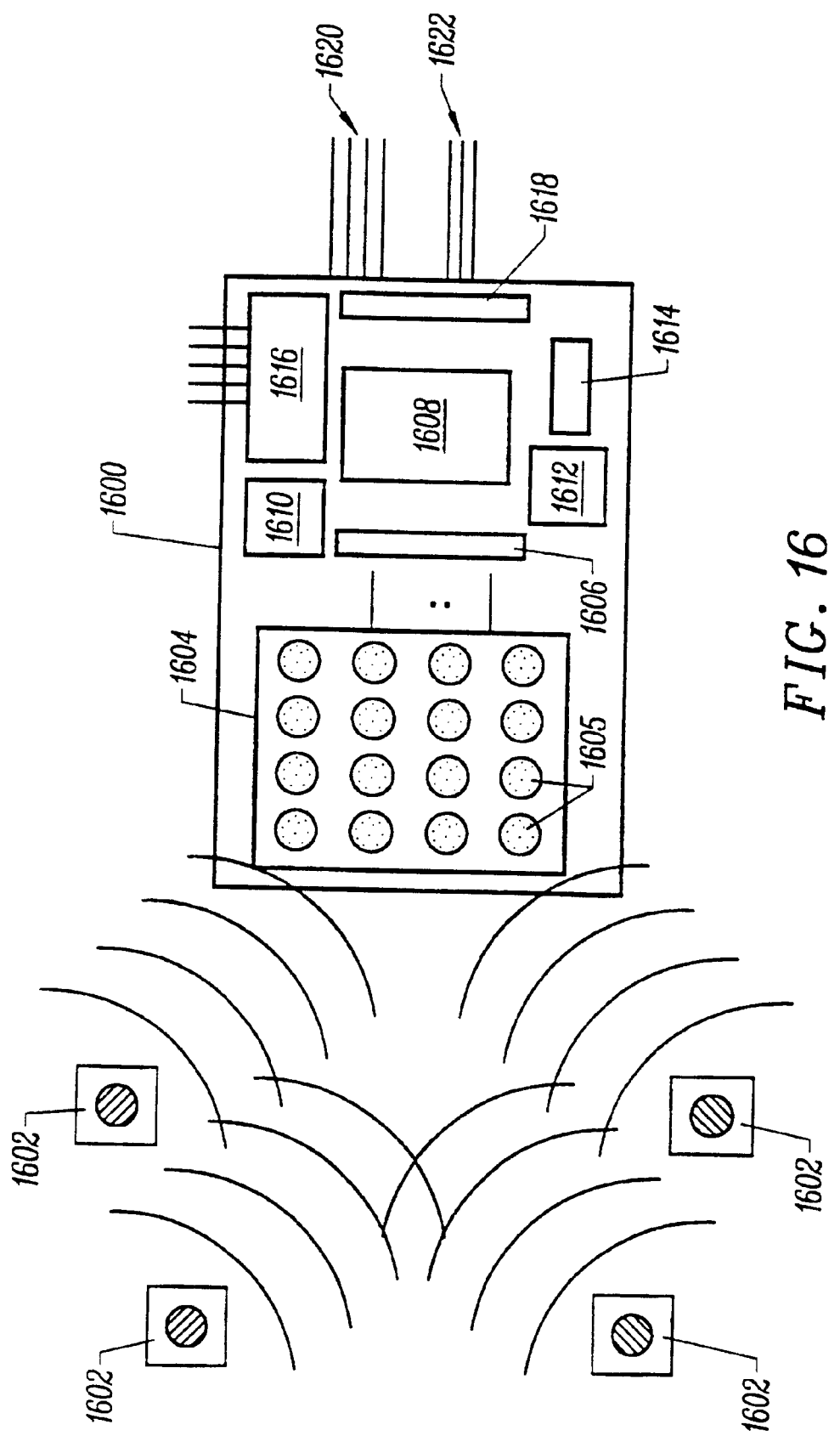
FIG. 16 shows a schematic of an audio device suitable for use with the present invention.
Figure 17:
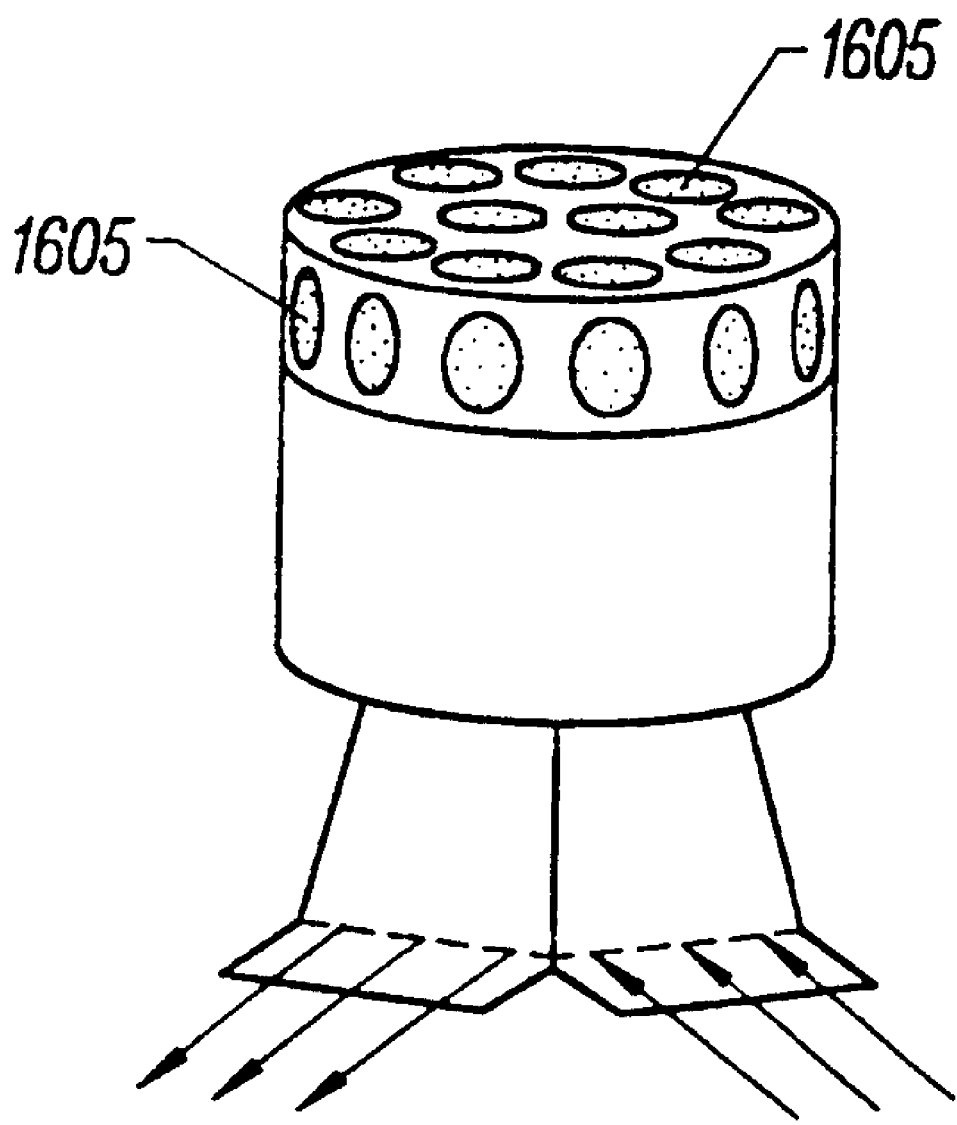
FIG. 17 shows a smart microphone array device.

FIG. 16 shows a schematic of audio device suitable for use with the present invention. This is a smart sound sensing and processing device 1600 that may be programmed to perform a variety of functions. This device may be used in whole or in part within a computing or communications device to implement voice or acoustic signal based interface. Smart microphone 1600 receives a plurality of sounds from sources 1602 through a microphone array 1604. Microphone array 1604 is made up of an array of microphone elements 1605. Microphone array 1604 is connected to an A/D converter 1606 and one or more DSPs or integrated DSP cores 1608. DSP core 1608 is connected to a memory device 1610, at least one digital circuit 1612 and analog circuit 1614, an online programming interface 1616, and a D/A converter 1618. Memory device 1610 may contain the signal separation and recovery algorithms and procedures described earlier. Digital circuit 1612 and analog circuit 1614 may include signal conversion, conditioning and interface circuits. D/A converter 1618 feeds output channels 1620 and other outputs 1622. Although it is shown that they lay on a flat surface in the drawing, the microphone axes need not be coplanar. In fact, a cylindrical arrangement similar to the one shown in FIG. 17 would be desirable to pick up sounds from all directions. Some of these directions may be disabled. This smart microphone contains microphone elements 1605 depicted in its schematic in FIG. 16. The device is minimally capable of audio signal separation and recovery tasks. Additional features may be added by programming these features as well onto the digital signal processor. This device may be used as a replacement for ordinary microphones after being pre-programmed or used in new audio interfaces that exploit its flexibility by online programming. Although it is drawn larger than the conventional microphone to illustrate its components, it may actually be of comparable size or smaller due to its high level of integration.

Microphone technology and microphone arrays. A microphone is a device that converts acoustic energy received as vibratory motion of air particles into electrical energy sent along the microphone cable as a vibratory motion of electrons. Once this conversion has taken place, the sound information is freed from the normal acoustic constraints. It can be amplified, transmitted on a wire or via radio waves, it can be stored, and processed.

Today the microphone is a ubiquitous device. Many types of microphones exist and this section presents a brief overview of the technology associated with microphones. The desirable features of any microphone depend to some extent on the particular applications for which it is intended. However, in studying the principles of acoustic transduction as well as the manufacturer's specifications of microphones, the following performance categories have an important bearing on the selection of appropriate microphones:

1. frequency response on axis, which refers to signal output versus frequency for a constant acoustic level
2. directivity, which refers to the response of the microphone to sounds received from all angles on a plane, e.g. omnidirectional, cardioid, shotgun
3. frequency response off-axis, same as (1) but off the off-axis
4. sensitivity, or the efficiency of the microphone to convert acoustic energy to electrical signal
5. self noise, or the inherent noise level
6. distortion, in other words, the deviation from a linear response to acoustic energy With the exception of a few exotic types based on heated wire or a cloud of ions, all practical microphones make the conversion of acoustic energy to mechanical energy via the mechanical vibrations of in response to sound waves of a thin, light diaphragm. Generally this diaphragm is circular in shape and clamped at its periphery, although other shapes do occur and including the thin ribbon variety stretched between clamps at each end. It appears therefore that the energy conversion in microphones commonly takes place in two stages, albeit simultaneously: acoustical to mechanical and mechanical to electrical.

In the first stage, the two main ways in which a microphone of any transducer type extracts mechanical energy from the sound wave are pressure operation and pressure gradient operation. The distinguishing feature of pressure operated microphones is that the rear surface of the microphone is enclosed so that the actuating force is that of the instantaneous air pressure at the front. A small vent is cut through the casing to equalize the long term internal and external air pressures. A purely pressure operated microphone is omnidirectional. A pressure-gradient microphone, on the other hand, is built with both faces of its diaphragm equally open to air. The effective force on the diaphragm at any instant is not simply due to the pressure at the front end but to the difference in pressure, or the pressure gradient between the front and the back. This has an important bearing on the system's directivity. A whole family of directivity patterns become possible when one combines pressure and pressure gradient operation.

The second stage may use a variety of electrical generator principles to convert the extracted mechanical energy to electrical energy and microphones tend to be categorized accordingly. Some of the common categories can be delineated as follows:

1. moving coil (dynamic) microphone based on the principle that motion of a conductor in an electric field generates an EMF causing flow of current in the conductor
2. ribbon microphone based on the same principle as the dynamic microphone, where the ribbon acts as the diaphragm and the conductor
3. condenser (capacitor or electrostatic) microphone based where the transducer element is a capacitor which varies based on the vibration of the diaphragm
4. electret microphone which uses a polarized or neutral diaphragm with the fixed plate coated with electret material (back polarized)
5. piezoelectric microphone using crystalline or ceramic materials which possess piezoelectric properties where vibrations of a diaphragm are transmitted to the bimorph (oppositely polarized slabs joined to form a single unit) by a rod giving rise to an alternating voltage at the output terminals proportional to the effective displacement
6. the carbon microphone, used in many telephones, which uses granules of carbonized hard coal that when subjected to external pressure variations will cause their areas of contact to increase or decrease During the past decade silicon micromachining techniques have been successfully applied to the fabrication of miniature microphones on silicon wafers. Silicon microphones based on different principles, e.g. piezoelectric, piezoresistive, and capacitive principles are also available. There is growing interest in this area due to numerous advantages in improved dimension control, extreme miniaturization, the ability to integrate on-chip circuitry, and potential low cost as a result of batch processing.

Here we include discussion of two types of micromachined microphones, namely capacitive and piezoelectric.

Micromachined capacitive microphones. Most silicon microphones are based on capacitive principles because of the higher sensitivity flat frequency response and low noise level. The capacitive microphones can be divided into electret microphones, condenser microphones and condenser microphones with integrated field effect transistors (FETs). The capacitive microphone consists of a thin flexible diaphragm and a rigid backplate. The two parts can be realized either as two separate silicon chips or one single chip. On the backplate acoustic holes are formed by use of anisotropic etching. The diaphragms of the silicon microphones can be thin Mylar foil, polyester, a low pressure chemical vapor deposition (LPCVP) silicon nitride film, etc.

For the two chip structural microphone silicon direct bonding, anodic bonding, or polymer adhesives are used to assemble the diaphragm and the backplate. Such assembly progress always involves laborious alignment procedures, and given that most bonding processes also involve procedures that affect integrated electronics and change the material characteristics it seems that microphones with single chip solutions should be preferable.

The fabrication process sequence of this microphone uses seven masks including silicon anisotropic etching and sacrificial layer etching. It is claimed that diaphragms with corrugations have several advantages for the design of silicon condenser microphones. First, the corrugation reduces the intrinsic stress of the thin diaphragm which results in higher sensitivity. Second, it can be fabricated by use of a single wafer process. Acoustic holes are produced automatically after the air gap is formed, i.e. the sacrificial layer is removed and the diaphragm is released. The sensitivity and the resonance frequency of the diaphragm can be optimized by choosing appropriate structure parameters.

Micromachined piezoelectric microphones. The performance limits of micromachined piezoelectric microphones has been explored both theoretically and experimentally. In addition, such devices have been manufactured and tested using residual-stress compensation with on-chip, large-scale-integrated (LSI) CMOS circuits in a joint, interactive processes between commercial CMOS foundries and university micromachining facilities. One such 2500×2500×3.5 pm cube microphone has a piezoelectric ZnO layer on a supporting low-pressure chemical-vapor-deposited (LPCVD), silicon-rich, silicon nitride layer. The packaged microphone has a resonant frequency of 18 kHz, a quality-factor Q=40 (approx.), and an unamplified sensitivity of 0.92 $\mu$V/Pa, which agrees well with the calculated sensitivity. Differential amplifiers provide 49 dB gain with 13 $\mu$V A-weighted noise at the input.

Related processing techniques to align features on the front side of a wafer to those on its backside have been attempted for bulk micromachining. Towards this end, a tiny (30 $\mu$m-square and 1.6 $\mu$m-thick) diaphragm can serve as an alignment pattern. At the same time that the alignment diaphragm is made, much thicker, large-area diaphragms can be partially etched using "mesh" masking patterns in these areas. The mesh-masking technique exploits the etch-rate differences between (100) and (111) planes to control the depths reached by etch pits in selected areas. The large, partially etched diaphragms (2 to 3 mm squares) are sufficiently robust to survive subsequent IC-processing steps in a silicon-foundry environment. This reported size will decrease with the availability of smaller feature sizes. The thin alignment diaphragm can be processed through these steps because of its very small area. The partially etched diaphragms can be reduced to useful thicknesses in a final etch step after the circuits have been fabricated. This technique has been successfully employed to fabricate microphones and on-chip CMOS circuits.

Use of micromachined piezoelectric microphones creates the opportunity to build electrothermally tunable resonant frequencies. Specific devices with this property achieve resonant-frequency modulation, $f_m$ via the thermal expansion induced by on-diaphragm, polysilicon heaters. A near linear decrease in $f_m$ with increasing resistor power at the rate of −127 Hz/mW has been measured between 20.8 and 15.1 kHz. The mechanical quality-factors $Q_m$ are approximately 100. Moreover, the temperature-power curve is linear with slope 0.3 Celsius/mW at the hottest sense element on the diaphragm. The variable resonant frequency and high quality-factor provide an acoustic filtering capability which may have applications to ultrasonic range finders, velocity sensors, signaling elements, and speech processing.

Unlike its predecessor with diaphragms clamped at four ends, combined microphone-microspeaker devices contain a cantilever that is free from the residual stresses found with clamped diaphragms. Use of the cantilever allows for sensitivity levels greater than other microphones with micromachined diaphragms. In addition, when the device is driven electrically as an output transducer, i.e. microspeaker, the relatively large deflections of the free end produce significant acoustic output.

Theory of the integrated microphone can be developed through combining mechanics, piezoelectricity and circuit theory. Also required are theoretical optimizations for sensitivity-bandwidth product and signal-to-noise ratio.

Microphone array assembly and adaptive tuning of microphone elements. The current use of the term "microphone array" refers to arrangements of microphones across large distances, in the order of meters. This is a result of two factors. First, the diameter of most common microphones do not allow for smaller array dimensions. Second, so far there has been little need to pack microphones very closely since the primary motivation of building microphone arrays is to provide the necessary input to beamforming algorithms, which, due to the large wavelength associated with most audio signals (0.1–1.0 meter) require large separation of microphone elements. For example, a one dimensional microphone array used for identifying speaker location includes 51 microphones are arranged in a line with a uniform separation of 4 cm across a distance over 2 m. This arrangement provides selectivity without spatial aliasing for frequencies up to 4000 Hz.

Only with the advent of technology and new algorithms, with the understanding of the workings of the inner ear, we now have a reason to build structures resembling the inner ear, to do the kinds of signal processing needed for truly smart audio interfaces. From this point forward in this description, the term microphone array is used to refer to compact structures, less than 5 cm in any dimension. At this size, a single device or interface can contain the array and there is no need to wire a whole room or enclosure with microphones in order to carry out sophisticated audio signal functions, such as signal separation. Although the physical dimensions make beamforming and localization mathematically impractical at this size, the ultimate goal is to integrate all the functions that a person can perform with one good ear onto such a device. Multiple devices can then be arranged to solve further problems that require physical dimensions suitable for source localization and beamforming.

The integration of the microphone onto silicon enables tight control of microphone dimensions and spacing. This in turn is expected to result in more reliable exploitation of beamformning algorithms. However, the response characteristics of the micromachined microphone elements are less predictable than their conventional counterparts. Several issues involved in tight coupling of the piezoelectric microphones remain unresolved. Note that we are viewing the individual micromachined or microelectromechanical system (MEMS) device in this context as a single component in an array of similar units, analogous to a single pixel in a CCD array or a transistor on an integrated circuit.

Since the signals from each MEMS device commonly exhibits offsets and nonlinearities due to existing physical constraints in the manufacturing process, the transduced signals must rely on off-the-shelf microelectronics for conditioning, testing, and one-time factory calibration in order to generate reliable measurements for diagnosis and control. Such one-time factory calibration, however, is not sufficient for generalized use due to, e.g. radiation, device aging, and temperature variations. Furthermore, when one considers tightly coupling similar and even disparate MEMS devices on the same substrate, external fixes to the problem would overcome the advantages of miniaturization afforded by MEMS.

This application of the invention uses integrated adaptive systems alongside the acoustic sensors because it provides the ability to modify the relationships on or offline in the presence of anomalies and nonlinearity. In addition, using modular design structure renders the augmentation of the signal conditioning system straightforward.

Digital signal processors. There exist many digital signal processors (DSP) for audio, speech, and multimedia applications. It will be up to the tradeoffs in a particular application to select the best processor families for the separation and recovery of audio signals. The choices are between various architectures and numerical representations, e.g. floating or fixed point. To achieve a highly integrated solution (e.g. one chip) may require the embedding of a DSP core either from a pre-designed device or designed from standard silicon cell libraries.

The compiler front-end to the DSP assembler and linker creates portability between the two implementation options described in this invention. There is thus a two-way connection between the high level language algorithm of the software emulation implementation and the hardware accelerated emulation implementation. In addition, a similar direct link exists between many computing environments and the DSP emulation environments, for example, C/C++ library and compilers for various processors.

It is desirable to generate fast and compact assembly code specifically for each digital signal processor. Unfortunately, the assembly code generated by a specific DSP compiler is often not as optimal as desired. Various tool environments for digital processor design and co-design are composed of a hierarchy of models. Starting from the higher behavioral level, this layered description facilitates the identification and correction of design errors before they are physically committed. Moreover, it also gives a fairly accurate performance estimate provided that the described devices can in fact be physically realized.

Programmable logic can be an integral part of the related development process. A programmable DSP core (a DSP processor that is designed for integration into a custom chip) may be integrated with custom logic to differentiate a system and reduce system cost, space, and power consumption.

Signal conversion, conditioning and interface circuits. Signal conversion, conditioning and interface circuits are readily available as discrete components, e.g. A/D and D/A converters, memory IC's, timers, op amps, filters, etc. For the sake of rapid prototyping and programmability it may be desirable to use programmable devices, both analog and digital.

Many digital (field programmable gate arrays) FPGA vendors are offering increasing complexity and gate and pin count devices for programming. Further reference is made to reconfigurable hardware in its various forms, which include dynamic system resident reconfiguration and virtual hardware and reconfigurable DSP cores. For adaptive processing algorithms and their implementation, there exists a growing opportunity for evolving seamless integrations of software and hardware, as well as integration of processor and sensor. Given that the invention involves both analog and digital signals reference is also made to analog programmability of hardware, e.g. Electrically Programmable Analog Circuit (EPAC). It may be advantageous to combine analog, digital and mixed signal programmable devices with custom electronic models or discrete components as necessary. It may also be beneficial to pursue custom circuits and structures that can ultimately be integrated readily alongside acoustic sensing devices.

The foregoing description of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A signal processing system, comprising:
   at least one sensor for detecting a plurality of input signals comprising at least one source signal;
   a storage device coupled to the at least one sensor for storing the input signals;
   an architecture processor coupled to the storage device for defining and determining a signal separation architecture, the signal separation architecture defining a relationship between the plurality of input signals and at least one output signal, the relationship having constant parameters and time-varying parameters;
   an update processor coupled to the architecture processor for determining a rate of change for the time-varying parameters in response to an associated rate of change; and
   an output processor coupled to the architecture processor for providing the at least one output signal based on the signal separation architecture, the constant parameters, and the time-varying parameters, the at least one output signal estimating the at least one source signal;
   wherein the signal separation architecture models a mixing environment and a separation environment as a linear dynamic system, wherein a mixing model is of the form $$x = A\overline{f height x} + \overline{B}s, \text{ and } m = C\overline{f height x} + \overline{D}s,$$

wherein the signal separation architecture is of the form $$\dot{x} = Ax + Bm, \text{ and } u = Cx + Dm,$$

wherein s is an n-dimensional source signal vector, x is an internal state, m is an m-dimensional measurement vector, u is an n-dimensional output, and A, B, C, and D are parameter matrices.

2. The signal processing system of claim 1, wherein inversion relationships between the parameter matrices are of the form $$C \stackrel{\Delta}{=} -\overline{D}^{-1}\overline{C}$$

$$D \stackrel{\Delta}{=} \overline{D}^{-1}$$

$$A \stackrel{\Delta}{=} \overline{A} - \overline{B}\overline{D}^{-1}\overline{C}, \text{ and}$$

$$B \stackrel{\Delta}{=} \overline{B}\overline{D}^{-1}.$$

3. The signal processing system of claim 1, wherein a number of measurements is greater than a number of source signals, wherein inversion relationships between the parameter matrices are of the form $$C \stackrel{\Delta}{=} -[\overline{D}^T\overline{D}]^{-1}\overline{D}^T\overline{C}$$

$$D \stackrel{\Delta}{=} -[\overline{D}^T\overline{D}]^{-1}\overline{D}^T$$

$$A \stackrel{\Delta}{=} \overline{A} - \overline{B}[\overline{D}^T\overline{D}]^{-1}\overline{D}^T\overline{C}, \text{ and}$$

$$B \stackrel{\Delta}{=} \overline{B}[\overline{D}^T\overline{D}]^{-1}\overline{D}^T.$$

4. The signal processing system of claim 1, wherein the mixing model is represented by a time domain relation $$m(t) = \overline{D}s(t) + \sum_{k=1}^{L} \overline{C}_k s^{(k)}(t) - \sum_{k=1}^{N} \overline{A}_k m^{(k)}(t),$$

wherein k represents the kth derivative in the continuous time case and k delay samples in the discrete time case.

5. The signal processing system of claim 4, wherein the signal separation architecture is of a form $$u(t) = Dm(t) + \sum_{k=1}^{L'} C_k m^{(k)}(t) - \sum_{k=1}^{N'} A_k u^{(k)}(t),$$

wherein dimensions of C and D are n×m, and dimensions of A are n×n, wherein $u(t) = W\Phi$, where $W = [D C_1 \ldots C_{L'}, -A_1 \ldots -A_{N'}]$, and $\Phi^T = [m(t)^T m^{(1)^T} \ldots m^{(L)^T}; u^{(1)^T} \ldots u^{(N')^T}].$ 6. The signal processing system of claim 1, wherein computing parameter matrix C comprises using at least one weight update rule selected from a group comprising $\dot{C} = \eta(\gamma I - K)$, $\dot{C} = \eta(\gamma I - K)C$, $\dot{C} = \eta(\gamma I - K)C^{-T}$, $\dot{C} = \eta(\gamma \text{diag}(K) - K)$, $\dot{C} = \eta(\gamma \text{diag}(K) - K)C$, $\dot{C} = \eta(\gamma \text{diag}(K) - K)C^{-T}$, $\dot{C} = \eta(\gamma \overline{\text{diag}(K)} - K)$, $\dot{C} = \eta(\gamma \overline{\text{diag}(K)} - K)C$, $\dot{C} = \eta(\gamma \overline{\text{diag}(K)} - K)C^{-T}$.

wherein $\gamma \geq 0$ and diag(K) are time averaged values of diag(K), realized by averaging one or more samples of the diag(K) matrix, wherein η is the rate of adaptation, wherein superscript (−T) is an inverse transpose, wherein diag(K) is a diagonal matrix where all elements except the diagonal elements are equal to zero and the diagonal elements of diag(K) are equal to those of K, wherein matrices K and L are outer product matrices, wherein $K = f(u)g(x)^T$, and $L = f(u)g(u)^T$, wherein f and g are odd functions.

7. The signal processing system of claim 6, wherein computing parameter matrix D comprises using at least one weight update rule selected from a group comprising $\dot{D} = \eta(\alpha I - L)$, $\dot{D} = \eta(\alpha I - L)D$, $\dot{D} = \eta(\alpha I - L)D^{-T}$, $\dot{D} = \eta(\alpha \text{diag}(L) - L)$, $\dot{D} = \eta(\alpha \text{diag}(L) - L)D$, $\dot{D} = \eta(\alpha \text{diag}(L) - L)D^{-T}$, $\dot{D} = \eta(\alpha \overline{\text{diag}(L)} - L)$, $\dot{D} = \eta(\alpha \overline{\text{diag}(L)} - L)D$, $\dot{D} = \eta(\alpha \overline{\text{diag}(L)} - L)D^{-T}$.

wherein α>0 and diag(L) are time averaged values of the diag(L) realized by averaging one or more samples of the diag(L) matrix, wherein T is the rate of adaptation, wherein superscript (−T) represents an inverse transpose, and diag(L)

is a diagonal matrix where all elements except the diagonal elements are equal to zero and the diagonal elements of diag(L) are equal to those of L.

8. The signal processing system of claim 1, wherein at least one signal separation process is overlapped in time with at least one other signal separation process.

9. The signal processing system of claim 1, wherein at least one signal separation process uses adaptive parameter estimation, wherein the adaptive parameter estimation is performed using at least one select data set of a data stack, wherein the at least one select data set is controlled by at least one result of the at least one signal separation process.

10. The signal processing system of claim 1, wherein the at least one sensor is arranged in a sensor array, the sensor array having a directional response pattern, wherein the directional response pattern is capable of being modified by performing signal processing on the plurality of input signals.

11. The signal processing system of claim 1, wherein a quantity of the plurality of input signals and a quantity of the at least one output signal are not equal.

12. The signal processing system of claim 11, wherein at least one output signal is a function of at least two source signals.

13. The signal processing system of claim 11, wherein at least two output signals are functions of a same source signal.

14. The signal processing system of claim 1, wherein the provision of the at least one output signal is based on a plurality of internal states of the signal processing system.

15. A signal processing system, comprising:
   at least one sensor for detecting a plurality of input signals comprising at least one source signal;
   an architecture processor in communication with the at least one sensor for determining a signal separation architecture, the signal separation architecture defining a relationship between the plurality of input signals and at least one output signal, wherein the signal separation architecture comprises a state space representation that establishes the relationship between the plurality of input signals and the at least one output signal of the form $$\dot{x}=Ax+Bm, \text{ and } u=Cx+Dm$$

wherein x is an internal state, m is a measurement vector, u is an output representation, and A, B, C, and D are parameter matrices; and
   an output coupled to the architecture processor for providing the at least one output signal.

16. The signal processing system of claim 15, wherein the provision of the at least one output signal is further based on at least one previously computed state of the state space representation.

17. The signal processing system of claim 15, wherein the provision of the at least one output signal is further based on at least one current state and previously computed state of the state space representation.

18. The signal processing system of claim 15, wherein the state space representation is mapped onto a finite impulse response (FIR) filter.

19. The signal processing system of claim 15, wherein the state space representation is mapped onto an infinite impulse response (IIR) filter.

20. The signal processing system of claim 15, wherein the state space representation is generalized to a nonlinear time variant function.

21. A signal separation processing method, comprising:
   receiving and storing a plurality of input signals comprising at least one source signal;
   defining a signal separation architecture, the signal separation architecture defining a relationship between the plurality of input signals and at least one output signal;
   initializing constant and time varying parameters of the relationship;
   determining the time varying parameters in response to the rate of change associated with each time varying parameter; and
   providing the at least one output signal based on the signal separation architecture and the constant and time varying parameters, the at least one output signal estimating the at least one source signal;
   wherein the signal separation architecture models a mixing environment and a separation environment as a linear dynamic system, wherein a mixing model is of the form $$x=A\!f\!heigh\bar{t}x+\bar{B}s, \text{ and } m=C\!f\!heigh\bar{t}x+\bar{D}s,$$

wherein the signal separation architecture is of the form $$\dot{x}=Ax+Bm, \text{ and } u=Cx+Dm$$

wherein s is an n-dimensional source signal vector, x is an internal state, m is an m-dimensional measurement vector, u is an n-dimensional output, and A, B, C, and D are parameter matrices.

22. The signal separation processing method of claim 21, wherein inversion relationships between the parameter matrices are of the form $$C \stackrel{\Delta}{=} -\bar{D}^{-1}\bar{C}$$
$$D \stackrel{\Delta}{=} \bar{D}^{-1}$$
$$A \stackrel{\Delta}{=} \bar{A} - \bar{B}\bar{D}^{-1}\bar{C}, \text{ and}$$
$$B \stackrel{\Delta}{=} \bar{B}\bar{D}^{-1}.$$

23. The signal separation processing method of claim 21, wherein a number of measurements is greater than a number of source signals, wherein inversion relationships between the parameter matrices are of the form $$C \stackrel{\Delta}{=} -[\bar{D}^T\bar{D}]^{-1}\bar{D}^T\bar{C}$$
$$D \stackrel{\Delta}{=} -[\bar{D}^T\bar{D}]^{-1}\bar{D}^T$$
$$A \stackrel{\Delta}{=} \bar{A} - \bar{B}[\bar{D}^T\bar{D}]^{-1}\bar{D}^T\bar{C}, \text{ and}$$
$$B \stackrel{\Delta}{=} \bar{B}[\bar{D}^T\bar{D}]^{-1}\bar{D}^T.$$

24. The signal separation processing method of claim 21, wherein the mixing model is represented by a time domain relation $$m(t) = \bar{D}s(t) + \sum_{k=1}^{L}\bar{C}_k s^{(k)}(t) - \sum_{k=1}^{N}\bar{A}_k m^{(k)}(t),$$

wherein k represents the kth derivative in the continuous time case and k delay samples in the discrete time case, s(t) is a source signal, m(t) is a mixture signal, and u(t) is a separated output signal, wherein the signal separation architecture is of a form $$u(t) = Dm(t) + \sum_{k=1}^{L'} C_k m^{(k)}(t) - \sum_{k=1}^{N'} A_k u^{(k)}(t),$$

wherein dimensions of C and D are n×m, and dimensions of A are n×n, wherein $u(t)=W\Phi$, where $W=[DC_1 \ldots C_{L'}; -A_1 \ldots -A_{N'}]$, and $\Phi^T=[m(t)^T m^{(1)^T} \ldots m^{(L')^T}; u^{(1)^T} \ldots u^{(N')^T}]$.

25. The signal separation processing method of claim 21, wherein the rate of change of at least one set of time varying parameters is contained in at least one array having at least two dimensions.

26. The signal separation processing method of claim 25, wherein the at least one array comprises a function of an outer product of a linear expansive, or compressive function of a set of the output signals arranged in a first one dimensional array and a linear, expansive, or compressive function of a set of the output signals arranged in a second one dimensional array.

27. A signal separation processing method, comprising:
receiving a plurality of input signals resulting from at least one source signal;
defining a signal separation architecture, the signal separation architecture defining a relationship between the plurality of input signals and at least one output signal, wherein the signal separation architecture comprises a state space representation that establishes a relationship between the plurality of input signals and the at least one output signal of the form $\dot{x}=Ax+Bm$, and $u=Cx+Dm$ wherein x is an internal state, m is a measurement vector, u is an output representation, and A, B, C, and D are parameter matrices; and
determining the at least one output signal based on the signal separation architecture.

28. The signal separation processing method of claim 27, wherein a rate of change of at least one set of time varying parameters is contained in at least one array having at least two dimensions.

29. The signal separation processing method of claim 28, wherein the at least one array comprises a function of an outer product of a linear, expansive, or compressive function of a set of the output signals arranged in a first one dimensional array and a linear, expansive, or compressive function of a set of internal states of the state space architecture arranged in a second one dimensional array.

30. The signal separation processing method of claim 28, wherein the at least one array comprises a function of an outer product of at least one linear, expansive, or compressive function of a set of the output signals arranged in a first array having at least two dimensions and at least one linear, expansive, or compressive function of a set of the output signals arranged in a second array having at least two dimensions.

31. The signal separation processing method of claim 27, wherein a plurality of signal separation process operations are overlapped in time.

32. The signal separation processing method of claim 31, wherein at least one of the plurality of signal separation processes uses a predetermined set of constant values or a random set of numbers for initializing parameters.

33. The signal separation processing method of claim 31, wherein at least one of the plurality of signal separation processes uses parameters computed previously by another method overlapping in time.

34. The signal separation processing method of claim 31, wherein at least one of the plurality of signal separation processes is terminated.

35. The signal separation processing method of claim 34, wherein at least one of the plurality of signal separation processes uses parameters computed by at least one previously terminated signal separation process.

36. An acoustic signal discrimination system, comprising:
a plurality of acoustic sensors for detecting a plurality of input signals, wherein each input signal comprises different mixtures of a plurality of source signals;
a storage device coupled to the plurality of acoustic sensors for storing the plurality of input signals;
an architecture processor coupled to the storage device for determining an acoustic signal discrimination architecture that defines a relationship between the plurality of input signals and at least one output signal, the relationship comprising constant parameters and time varying parameters;
an update processor coupled to the architecture processor for determining a rate of change for the time varying parameters in response to an associated rate of change; and
an output processor coupled to the architecture processor for providing the at least one output signal based on the acoustic signal discrimination architecture, the constant parameters, and the time varying parameters, the at least one output signal estimating the at least one source signal;
wherein the acoustic signal discrimination architecture models a mixing environment and a separation environment as a linear dynamic system, wherein a mixing model is of the form $\bar{x}=\bar{A}f_{height}\bar{x}+\bar{B}s$, and $m=\bar{C}f_{height}\bar{x}+\bar{D}s$, wherein the signal separation architecture is of the form $\dot{x}=Ax+Bm$, and $u=Cx+Dm$ wherein s is an n-dimensional source signal vector, x is an internal state, m is an m-dimensional measurement vector, u is an n-dimensional output, and A, B, C, and D are parameter matrices.

37. The acoustic signal discrimination system of claim 36, wherein inversion relationships between the parameter matrices are of the form $C \triangleq -\bar{D}^{-1}\bar{C}$ $D \triangleq \bar{D}^{-1}$ $A \triangleq \bar{A} - \bar{B}\bar{D}^{-1}\bar{C}$, and $B \triangleq \bar{B}\bar{D}^{-1}$.

38. The acoustic signal discrimination system of claim 36, wherein a number of measurements is greater than a number of source signals, wherein inversion relationships between the parameter matrices are of the form $$C \triangleq -[\overline{D}^T\overline{D}]^{-1}\overline{D}^T\overline{C}$$

$$D \triangleq -[\overline{D}^T\overline{D}]^{-1}\overline{D}^T$$

$$A \triangleq \overline{A} - \overline{B}[\overline{D}^T\overline{D}]^{-1}\overline{D}^T\overline{C}, \text{ and}$$

$$B \triangleq \overline{B}[\overline{D}^T\overline{D}]^{-1}\overline{D}^T.$$

39. The acoustic signal discrimination system of claim 36, wherein the mixing model is represented by a time domain relation $$m(t) = \overline{D}s(t) + \sum_{k=1}^{L} \overline{C}_k s^{(k)}(t) - \sum_{k=1}^{N} \overline{A}_k m^{(k)}(t),$$

wherein k represents the kth derivative in the continuous time case and k delay samples in the discrete time case, s(t) is a source signal, m(t) is a mixture signal, and u(t) is a separated output signal, wherein the signal separation architecture is of a form $$u(t) = Dm(t) + \sum_{k=1}^{L'} C_k m^{(k)}(t) - \sum_{k=1}^{N'} A_k u^{(k)}(t),$$

wherein dimensions of C and D are n×m, and dimensions of A are n×n, wherein $u(t)=W\Phi$, where $W=[DC_1 \ldots C_{L'}; -A_1 \ldots -A_{N'}]$, and $\Phi^T=[m(t)^T m^{(1)^T} \ldots m^{(L')^T}; u^{(1)^T} \ldots u^{(N')^T}]$.

40. The acoustic signal discrimination system of claim 36, wherein the plurality of acoustic sensors comprises an acoustic sensor having a directional response pattern, wherein the directional response pattern is capable of being modified.

41. The acoustic signal discrimination system of claim 36, wherein a quantity of the plurality of input signals and a quantity of the at least one output signal are not equal.

42. The acoustic signal discrimination system of claim 41, wherein at least one output signal is a function of at least two source signals.

43. The acoustic signal discrimination system of claim 41, wherein at least two output signals are functions of the same source signal.

44. The acoustic signal discrimination system of claim 36, wherein provision of the at least one output signal is further based on internal states computed on at least one previous time instant.

45. An acoustic signal discrimination system, comprising:

at least one acoustic sensor for detecting a plurality of input signals, wherein each input signal comprises different mixtures of a plurality of source signals;

a storage device coupled to the at least one acoustic sensor for storing the plurality of input signals;

an architecture processor coupled to the storage device for determining an acoustic signal discrimination architecture that defines a relationship between the plurality of input signals and at least one output signal, the relationship comprising constant parameters and time varying parameters, the acoustic signal discrimination architecture is defined by at least one state space representation that establishes the relationship between input signals and output signals, each state space representation of the form $\dot{x}=Ax+Bm$, and $u=Cx+Dm$ wherein x is an internal state, m is a measurement vector, u is an output representation, and A, B, C, and D are parameter matrices;

an update processor coupled to the architecture processor for determining a rate of change for the time varying parameters in response to an associated rate of change; and an output processor coupled to the architecture processor for providing the at least one output signal based on the acoustic signal discrimination architecture, the constant parameters, and the time varying parameters, the at least one output signal estimating the at least one source signal.

46. The acoustic signal discrimination system of claim 45, wherein provision of the at least one output signal is further based on at least one current state of the acoustic signal discrimination architecture.

47. The acoustic signal discrimination system of claim 45, wherein provision of the at least one output signal is further based on at least one state of the acoustic signal discrimination architecture computed on at least one previous time instant.

48. The acoustic signal discrimination system of claim 45, wherein provision of the at least one output signal is further based on at least one current state and at least one state of the acoustic signal discrimination architecture computed on at least one previous time instant.

49. The acoustic signal discrimination system of claim 45, wherein the at least one state space representation is mapped onto a finite impulse response (FIR) filter.

50. The acoustic signal discrimination system of claim 45, wherein the at least one state space representation is mapped onto an infinite impulse response (IIR) filter.

51. The acoustic signal discrimination system of claim 45, wherein the at least one state space representation is generalized to a nonlinear time variant function.

* * * * *

UNITED STATES PATENT AND TRADEMARK OFFICE
CERTIFICATE OF CORRECTION

PATENT NO. : 6,625,587 B1  Page 1 of 1
DATED : September 23, 2003
INVENTOR(S) : Gamze Erten et al.

It is certified that error appears in the above-identified patent and that said Letters Patent is hereby corrected as shown below:

Column 1,
Line 2, please insert the following:
-- STATEMENT REGARDING FEDERALLY SPONSORED RESEARCH OR DEVELOPMENT The invention was made with Government support under Contract Nos. F33615-97-C-1118 and FF33615-98-C-1230. The Government has certain rights to the invention. --

Column 28,
Line 66, delete "T" and insert therefor -- $\eta$ --.

Signed and Sealed this

Ninth Day of March, 2004

JON W. DUDAS
*Acting Director of the United States Patent and Trademark Office*